United States Patent
Amako et al.

(10) Patent No.: US 9,705,056 B2
(45) Date of Patent: *Jul. 11, 2017

(54) GRADIENT POLYMER STRUCTURES AND METHODS

(71) Applicants: Dow Corning Corporation, Midland, MI (US); Dow Corning Toray Co., Ltd., Tokyo (JP)

(72) Inventors: Masaaki Amako, Chiba (JP); Geoffrey Bruce Gardner, Midland, MI (US); Steven Swier, Midland, MI (US); Shin Yoshida, Chiba (JP)

(73) Assignees: Dow Corning Corporation, Midland, MI (US); Dow Corning Toray Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/377,770

(22) PCT Filed: Feb. 7, 2013

(86) PCT No.: PCT/US2013/025126
§ 371 (c)(1),
(2) Date: Aug. 8, 2014

(87) PCT Pub. No.: WO2013/119796
PCT Pub. Date: Aug. 15, 2013

(65) Prior Publication Data

US 2015/0207047 A1    Jul. 23, 2015

Related U.S. Application Data

(60) Provisional application No. 61/596,959, filed on Feb. 9, 2012.

(51) Int. Cl.
G02B 1/04 (2006.01)
H01L 33/58 (2010.01)
H01L 33/56 (2010.01)

(52) U.S. Cl.
CPC ............... H01L 33/58 (2013.01); G02B 1/04 (2013.01); H01L 33/56 (2013.01);
(Continued)

(58) Field of Classification Search
None
See application file for complete search history.

(56) References Cited

U.S. PATENT DOCUMENTS 3,017,385 A    1/1962 Sprung et al.
3,294,737 A *  12/1966 Krantz ............... C08G 77/00
                                              516/199
(Continued)

FOREIGN PATENT DOCUMENTS

CN    104220902 A    12/2014
JP    08027036       1/1996
(Continued)

OTHER PUBLICATIONS

Hartney, M. A. And Novembre, A. E., "Poly (methylstyrene-dimethylsiloxane) Block Copolymers as Bilevel Resists" SPIE, vol. 539, 1985, pp. 90-96.*
(Continued)

Primary Examiner — Erik Kielin
(74) Attorney, Agent, or Firm — Schwegman Lundberg & Woessner, P.A.

(57) ABSTRACT

An optical article includes a silicone-containing composition. The silicone composition includes a first region having a first refractive index and a second region having a second refractive index. The first refractive index is different than the second refractive index.

20 Claims, 6 Drawing Sheets

(52) U.S. Cl.
CPC ..... *C08L 2205/18* (2013.01); *H01L 2933/005* (2013.01); *H01L 2933/0058* (2013.01); *Y10T 428/24942* (2015.01)

(56) References Cited

U.S. PATENT DOCUMENTS

| | | | |
|---|---|---|---|
| 3,436,439 A * | 4/1969 | Woods | C08G 77/00 524/860 |
| 5,054,348 A | 10/1991 | Anciaux et al. | |
| 5,075,103 A | 12/1991 | Halloran et al. | |
| 5,268,433 A | 12/1993 | Ikeno et al. | |
| 5,883,177 A | 3/1999 | Colaianna et al. | |
| 5,968,882 A | 10/1999 | Matsuhisa et al. | |
| 6,013,712 A | 1/2000 | Chittofrati et al. | |
| 6,100,325 A | 8/2000 | Chittofrati et al. | |
| 6,144,795 A | 11/2000 | Dawes et al. | |
| 6,468,664 B1 * | 10/2002 | Park | C08G 73/1039 428/428 |
| 6,469,116 B2 | 10/2002 | Maccone et al. | |
| 6,869,920 B2 | 3/2005 | Marchionni et al. | |
| 6,964,941 B2 | 11/2005 | Argentieri et al. | |
| 7,186,300 B2 | 3/2007 | Giacobbi et al. | |
| 7,373,060 B2 | 5/2008 | Satake et al. | |
| 7,468,142 B2 | 12/2008 | Dournel | |
| 7,566,409 B1 | 7/2009 | Zastrow et al. | |
| 7,807,736 B2 | 10/2010 | Kashiwagi et al. | |
| 7,858,198 B2 | 12/2010 | Kashiwagi et al. | |
| 7,868,119 B2 | 1/2011 | Shiono et al. | |
| 8,507,642 B2 | 8/2013 | Marchionni et al. | |
| 8,557,952 B2 | 10/2013 | Marchionni et al. | |
| 8,664,353 B2 | 3/2014 | Tonelli et al. | |
| 8,865,815 B2 | 10/2014 | Nagashima et al. | |
| 8,865,830 B2 * | 10/2014 | Horstman | C08L 83/10 427/387 |
| 8,921,493 B2 | 12/2014 | Horstman et al. | |
| 8,921,494 B2 * | 12/2014 | Horstman | C08G 77/44 525/477 |
| 8,921,495 B2 * | 12/2014 | Horstman | C08G 77/14 525/477 |
| 8,957,147 B2 * | 2/2015 | Swier | C08G 77/14 524/477 |
| 9,000,472 B2 * | 4/2015 | Amako | H01L 33/501 257/100 |
| 9,006,356 B2 * | 4/2015 | Horstman | C09D 183/10 525/477 |
| 9,076,934 B2 * | 7/2015 | Horstman | C09D 183/10 |
| 9,175,140 B2 * | 11/2015 | Swier | C09D 183/14 |
| 2002/0190408 A1 * | 12/2002 | Houston | C08F 265/04 264/10 |
| 2005/0111808 A1 | 5/2005 | Shelnut et al. | |
| 2005/0156189 A1 * | 7/2005 | Deguchi | H01L 33/38 257/103 |
| 2006/0163532 A1 | 7/2006 | D'Aprille et al. | |
| 2007/0148476 A1 | 6/2007 | Khanarian et al. | |
| 2008/0193749 A1 | 8/2008 | Thompson et al. | |
| 2008/0197376 A1 | 8/2008 | Bert et al. | |
| 2009/0065792 A1 | 3/2009 | Thompson et al. | |
| 2009/0121190 A1 | 5/2009 | Parce et al. | |
| 2009/0225640 A1 | 9/2009 | Manabe et al. | |
| 2010/0069573 A1 * | 3/2010 | Arriola | C08F 36/04 525/209 |
| 2010/0129672 A1 | 5/2010 | Hao et al. | |
| 2010/0239776 A1 | 9/2010 | Yajima et al. | |
| 2011/0062424 A1 | 3/2011 | Grunzinger et al. | |
| 2012/0009382 A1 | 1/2012 | Kishimoto et al. | |
| 2012/0112211 A1 | 5/2012 | Fujii et al. | |
| 2012/0301094 A1 | 11/2012 | De Groot, Jr. et al. | |
| 2013/0165602 A1 | 6/2013 | Horstman et al. | |
| 2013/0168727 A1 | 7/2013 | Horstman et al. | |
| 2013/0171354 A1 | 7/2013 | Horstman et al. | |
| 2013/0245187 A1 | 9/2013 | Swier et al. | |
| 2014/0357827 A1 * | 12/2014 | Swier | C08G 77/44 528/10 |
| 2015/0001567 A1 | 1/2015 | Amako et al. | |
| 2015/0045486 A1 | 2/2015 | Horstman et al. | |

FOREIGN PATENT DOCUMENTS

| | | |
|---|---|---|
| JP | 08041446 | 2/1996 |
| JP | 11060720 | 3/1999 |
| JP | 2001031997 | 2/2001 |
| JP | 2003064345 | 3/2003 |
| JP | 2004075736 | 3/2004 |
| JP | 2004115622 | 4/2004 |
| JP | 2005181638 A | 7/2005 |
| JP | 2007148332 A | 6/2007 |
| JP | 2007524119 A | 8/2007 |
| JP | 2008532795 A | 8/2008 |
| JP | 4325645 | 6/2009 |
| JP | 2010107680 | 5/2010 |
| JP | 2010107680 A | 5/2010 |
| JP | 2010189602 | 9/2010 |
| JP | 2011012177 | 1/2011 |
| JP | 2013515276 A | 5/2013 |
| JP | 2015-511332 A | 4/2015 |
| WO | WO-2005/067524 A2 | 7/2005 |
| WO | WO-2005069388 A1 | 7/2005 |
| WO | WO-2011/084250 A2 | 7/2011 |
| WO | WO-2012/040302 A1 | 3/2012 |
| WO | WO-2012/040305 A1 | 3/2012 |
| WO | WO-2012/040367 A1 | 3/2012 |
| WO | WO-2012/040453 A1 | 3/2012 |
| WO | WO-2012/040457 A1 | 3/2012 |
| WO | WO-2013/082451 A1 | 6/2013 |
| WO | 2013109607 | 7/2013 |
| WO | WO-2013/101674 A1 | 7/2013 |
| WO | WO-2013/109607 A1 | 7/2013 |
| WO | WO-2013/119796 A1 | 8/2013 |
| WO | 2013134018 | 9/2013 |

OTHER PUBLICATIONS

"International Application Serial No. PCT/US2012/069701, International Search Report mailed Apr. 12, 2013", 4 pages.*

"International Application Serial No. PCT/US2012/069701, Written Opinion mailed Apr. 12, 2013", 7 pages.*

"International Application Serial No. PCT/US2013/025126, International Search Report mailed May 22, 2013", 4 pgs.

"International Application Serial No. PCT/US2013/025126, Written Opinion mailed May 22, 2013", 4 pgs.

"European Application Serial No. 13705350.0, Office Action mailed Sep. 16, 2014", 2 pgs.

"European Application Serial No. 13705350.0, Response filed Feb. 26, 2015 to Office Action mailed Sep. 16, 2014", 13 pgs.

"International Application Serial No. PCT/US2013/025126, International Preliminary Report on Patentability mailed Aug. 21, 2014", 6 pgs.

Amako, Masaaki, et al., "Solid State Light and Method of Forming", U.S. Appl. No. 14/369,981, filed Jun. 30, 2014, 78 pgs.

Swier, Steven, et al., "Optical Article and Method of Forming", U.S. Appl. No. 14/372,465, filed Jul. 16, 2014, 62 pgs.

Baney et al.; Silsesquioxanes; Chem, Rev. 1995. 1995 American Chemical Society; pp. 1409-1430.

Dow Corning; Silicone TM Chemistry—Silicone vs. Organic Polymers; Fascinating Silicone Chemistry Corner Silicones vs. Organics; http://www.dowcorning.com/content/discover/discoverchem/si-vs-organic.aspx; May 10, 2016.

"Japanese Office Action Application Serial No. 2014-556659, Office Action mailed Nov. 8, 2016", (With English Translation), 2 pgs.

"Taiwanese Application Serial No. 102105170, Response filed Dec. 23, 2016 to Office Action mailed Sep. 21, 2016", w/ English Translation, 43 pgs.

"Taiwanese Application Serial No. 102105170, Notice of Decision to Grant mailed Feb. 8, 2017", With English Translation, 3 pgs.

* cited by examiner

GRADIENT POLYMER STRUCTURES AND METHODS

CROSS-REFERENCE TO RELATED APPLICATIONS

This application is a U.S. national stage application filed under 35 U.S.C. §371 from International Application Serial No. PCT/US2013/025126, which was filed Feb. 7, 2013, and published as WO 2013/119796 on Aug. 15, 2013, and which claims the benefit of U.S. Provisional Patent Appl. Ser. No. 61/596,959, filed Feb. 9, 2012, which applications and publication are incorporated by reference as if reproduced herein and made a part hereof in their entirety, and the benefit of priority of each of which is claimed herein.

FIELD

This disclosure generally relates to gradient polymer structures and associated methods.

BACKGROUND

Optical devices, such as optical emitters, optical detectors, optical amplifiers, and the like, may emit or receive light via an optical surface. For various such devices, the optical surface may be or may include an electronic component or other component that may be sensitive to environmental conditions. Certain optical devices, such as opto-electronics generally, including light emitting diodes (LEDs), laser diodes, and photosensors, can include solid state electronic components that may be susceptible to electrical shorts or other damage from environmental conditions if not protected. Even optical devices that may not be immediately susceptible may degrade over time if not protected. Further, such optical devices may include optical surfaces, such as that emit or detect light, that may have a relatively high refractive index in comparison with air or other ambient gas.

SUMMARY

An optical article has been developed, such as that may be or include a polymeric structure, that may function as at least one of an encapsulant for protection from environmental factors and as a refractive index gradient to promote transition from a relatively high refractive index optical surface of the optical device to air. In various examples, the optical article is a silicone-containing composition. In some embodiments, the silicon-containing composition is a silicone-containing hot melt composition. "Hot melt" compositions of the various examples and embodiments described herein may be reactive or unreactive. Reactive hot melt materials are chemically curable thermoset products which, after curing, are high in strength and resistant to flow (i.e., high viscosity) at room temperature. The viscosity of hot melt compositions tend to vary significantly with changes in temperature from being highly viscous at relatively low temperatures (e.g., at or below room temperature) to having comparatively low viscosities as temperatures increase towards a target temperature sufficiently higher than a working temperature, such as room temperature. In various examples, the target temperature is 200° C. Reactive or non-reactive hot melt compositions are generally applied to a substrate at elevated temperatures (e.g., temperatures greater than room temperature, for example greater than 50° C.) as the composition is significantly less viscous at elevated temperatures (e.g., at temperatures from about 50 to 200° C.) than at room temperature or thereabouts. In some cases, hot melt compositions are applied on to substrates at elevated temperatures as flowable masses and are then allowed to quickly "resolidify" merely by cooling. Other application methods include the application of sheets of hot melt material on, e.g., a substrate or superstrate, at room temperature, followed by heating.

In various examples, the polymeric structure is or includes includes a composition that is solid, e.g., at room temperature and may be a layered polymeric structure. In various other examples, the polymeric structure includes a composition having a refractive index greater than about 1.4. In still other examples, the polymeric structure includes an organosiloxane block copolymer. When the polymeric structure includes an organosiloxane block copolymer, the block copolymer has, in some examples, a weight average molecular weight of at least 20,000 g/mole. In some examples, the organosiloxane block copolymer may include 40 to 90 mole percent disiloxy units of the formula $[R^1_2SiO_{2/2}]$ arranged in linear blocks each having an average of from 10 to 400 disiloxy units $[R^1_2SiO_{2/2}]$ per linear block. In other examples, the organosiloxane block copolymer may also include 10 to 60 mole percent trisiloxy units of the formula $[R^2SiO_{3/2}]$ arranged in non-linear blocks each having a weight average molecular weight of at least 500 g/mole. In still other examples, the organosiloxane block copolymer may include 0.5 to 25 mole percent silanol groups $[\equiv SiOH]$. In these formulae, $R^1$ is independently a $C_1$ to $C_{30}$ hydrocarbyl and $R^2$ is independently a $C_1$ to $C_{20}$ hydrocarbyl. In addition, in various examples, at least 30% of the non-linear blocks may be crosslinked with another non-linear block. In other various examples, the non-linear blocks may be aggregated in nano-domains. In still other examples, each linear block of the organosiloxane block copolymer may be linked to at least one non-linear block. The layered polymeric structure may have improved thickness control in comparison with various layered polymeric structures known in the art.

FIGURES

DETAILED DESCRIPTION

Figure 1:
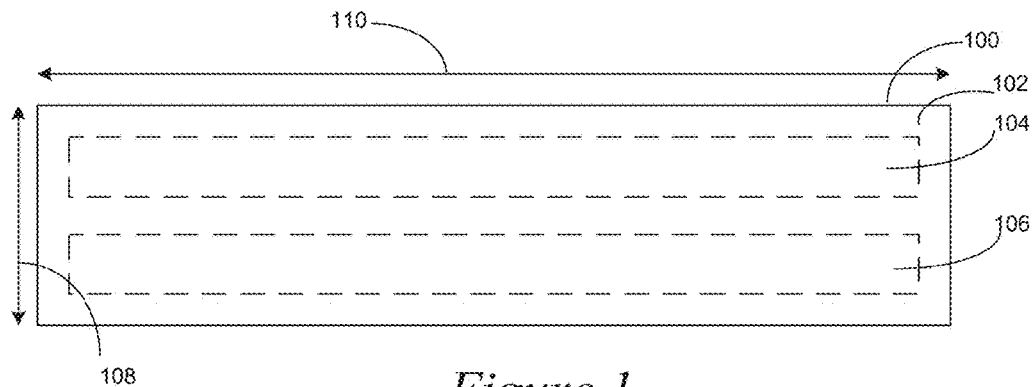
FIG. 1 is a side profile of a stylized optical article having a first and second region.

FIG. 1 is a side profile of a stylized optical article 100, such as a polymeric structure, such as may be utilized as an encapsulant in an optical assembly (below). As illustrated, the optical article 100 is a flat sheet (with depth not illustrated), but various optical articles 100 may be formed as or into other shapes and formats, such as lenses and the like. In an example, the optical article 100 includes or is made up of a silicone-containing composition 102, as disclosed in detail herein. The optical article 100 includes a first region 104 and a second region 106 in the silicone-containing composition 102. The first region 104 has a first refractive index and the second region 106 has a second refractive index different from the first refractive index. Between the two of them, the first region 104 and the second region 106 define a gradient, such as a refractive index gradient, extending from the first region 104 to the second region 106. The optical article 100 may be selected with various first and second refractive indices given the needs or requirements of the circumstances in which they are to be utilized.

While the regions 104, 106 are depicted for purposes of illustration as having clearly discernible two-dimensional height 108 and width 110, the regions 104, 106, as well as other regions disclosed herein, may be smaller or larger in relation to the optical article 100 generally. In particular, while a width 110 of the regions 104, 106 may be coextensive or substantially coextensive with the width of the optical article, the height 108 of the regions 104, 106 may be relatively small. In various examples on which the granularity of the gradient is small, the regions 104, 106 that incorporate the same or substantially the same refractive index may be only one molecule or a few molecules in height. It is to be understood that as the height 108 of the regions 104, 106, and all of the regions in other examples disclosed herein, decreases, more regions can be included in the composition 102 to define a higher-granularity gradient, where each region defines an area with a different refractive index. In compositions 102 with a continuous refractive index gradient the regions may be virtually infinitesimal in height 108.

In various illustrative examples, the regions 104, 106 of the composition 102 have a refractive index greater than 1.4 and may have a refractive index greater than 1.44, 1.5, 1.54, or alternatively greater than 1.55, such as determined using ASTM D542. In some examples, the composition has a refractive index greater than 2.5. In other embodiments, one or more regions 104, 106 of the composition 102 has a refractive index of from about 1.4 to about 2.5, e.g., from about 1.5 to about 2.5; from about 1.7 to about 2.4; from about 1.4 to about 1.7; or from about 1.9 to about 2.3.

The illustrative optical article 100 has different refractive indices in different regions 104, 106 through potential mechanisms disclosed herein. The resultant refractive index gradient may, in various examples, be gradual or may include abrupt changes. The resultant refractive indices may result from the use of different compositions in each region 104, 106 (e.g., an organosiloxane block copolymer composition comprising [Me$_2$SiO$_{2/2}$] linear portions and [PhSiO$_{3/2}$] resin portions in one region and a different organosiloxane block copolymer composition comprising [PhMeSiO$_{2/2}$] linear portions and [PhSiO$_{3/2}$] resin portions in a different region); may result from different concentrations of the same composition in each region 104, 106; may result from a gradient in concentration or molar amounts of certain components of the composition within each region or in going from one region to the next (e.g., a gradient in the mole percent disiloxy units of the formula [R$^1$$_2$SiO$_{2/2}$] and/or trisiloxy units of the formula [R$^2$SiO$_{3/2}$]); may result from the presence/absence of an additive or byproduct from the synthesis of the composition (e.g., PhMe-cyclic byproducts resulting from the synthesis of the linear components that are incorporated into the resin-1 organosiloxane block copolymers described herein) in one region and the presence/absence of a different additive or byproduct from the synthesis of the composition in a different region (e.g., a first region may comprise a stabilizer, such as the stabilizers described herein, and the second region may comprise a different stabilizer, relative to the one contained in the first region, or may lack a stabilizer altogether); may result from differences in the size or type of certain features present in the composition in each region (e.g., a first region may contain lamellar features of a given size or size distribution, while a second region may contain spherical features of a given size or size distribution); or any combination of the aforementioned differences between the composition in one region relative to the composition in a second region. The user of different compositions in each region 104, 106 may be from layers of different materials secured with respect to one another. In some embodiments, the term "region" or "regions" as used herein, may broadly refer to the "nano-domains" formed by the aggregation of non-linear blocks of a resin-linear block copolymer. The morphology of the nano-domains may be regular or irregular in shaped. For example, the morphology of the nano-domains may be spherically shaped, cylindrically shaped, tubular shaped, and in some instances lamellar shaped, as suggested above.

In various examples, the optical article 100 is between about 0.5 microns and five (5) millimeters thick (e.g., 50 to about 100 microns; from about 50 to about 75 microns; from about 60 to about 90 microns; from about 75 to about 100 microns; from about 0.3 to about 1.5 mm; from about 0.5 to about 1.3 mm; from about 1 to about 1.5 mm; or from about 0.75 to about 1.5 mm).

Figure 2:
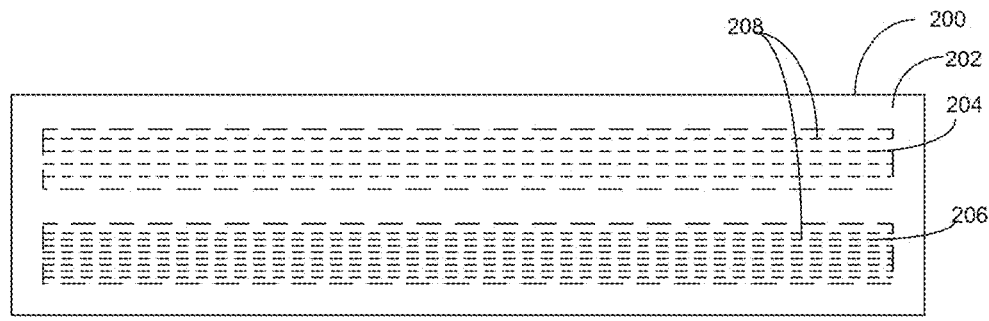
FIG. 2 is a side profile of a stylized optical article having a concentration gradient.

FIG. 2 is a side profile of a stylized optical article 200 that includes a silicone-containing composition 202. The composition 202 has a first region 204 having a first refractive index and a second region 206 having a second refractive index different from the first refractive index. The first region 204 has a first composition that includes a different concentration of the composition 202 than the second composition of the second region 206. As illustrated, the concentration of the composition 202 in the first and second regions 204, 206 is represented by the dashed lines 208, indicating that the second region 206 has a higher concentration of the composition 202 than the first region. In such an example, the second region 206 would have a higher refractive index than the first region 204.

The concentration of the composition 202 may be based on a percentage of the composition 202 as a total amount of material in a given volume of a region 204, 206. In various examples, the concentration is based on the presence of at least one of a disiloxy unit, a trisiloxy unit, and a silanol group, as disclosed herein. In an example, the composition comprises a gradient of disiloxy units and trisiloxy units. In another example, the composition includes a gradient of disiloxy units, trisiloxy units, and silanol groups. In still another example, the composition includes a gradient of trisiloxy units and silanol groups. In a further example, the composition includes a gradient of disiloxy units and silanol groups. In these examples, gradients in the substituents on the dilsiloxy and/or trisiloxy units are also contemplated. For example, there can be a gradient in the concentration of methyl and phenyl substituents on dilsiloxy units such that there are higher concentrations of methyl groups versus phenyl groups along different sections of the linear portion of, e.g., an organosiloxane block copolymer composition. In addition, silicone compositions ranging in refractive index can be used to prepare a composition gradient. For example, a phenyl-T-PDMS resin-linear with refractive index of 1.43 can be combined (e.g., layered) with a phenyl-T-PhMe resin-linear with a refractive index of 1.56 to create a gradient. Other compositions that could be combined to create a gradient include, but are not limited to, Naphthyl-T-PhMe resin linear with any of phenyl-T-PhME resin linear, (e.g., 45 wt % Ph-T-120 dp PhMe) or phenyl-T-PDMS (e.g., 34 wt % Ph-T-PDMS). Such examples may provide a relatively smooth transition from a high refractive index optical device, such as an LED, to an air surface. Still other compositions that could be combined to create a gradient include fluorine-containing resin linear compositions (e.g., 45 wt % methyl-T resin and 55 wt. % 99 dp trifluoropropyl siloxane) such as those disclosed in U.S. Provisional Patent Appl. Ser. No. 61/608,732, filed Mar. 9, 2012, the entire disclosure of which is incorporated by reference as if fully set forth herein.

Figure 3:
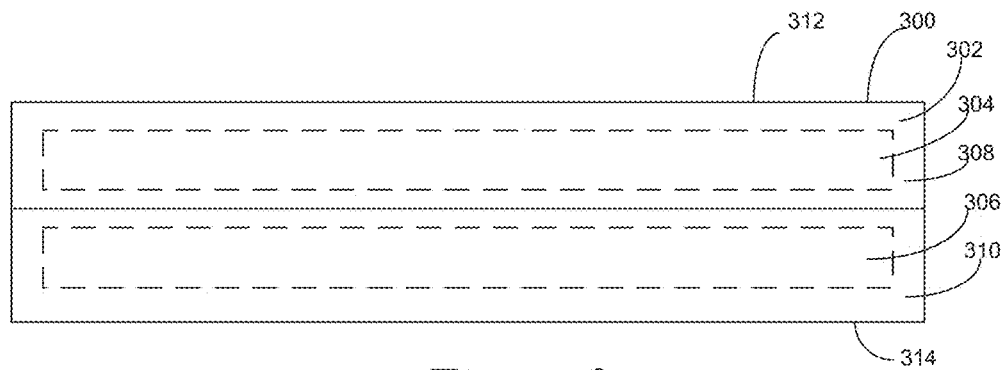
FIG. 3 is a side profile of a stylized optical article having a first and second layer.

FIG. 3 is a side profile of a stylized optical article 300 that includes a silicone-containing composition 302. The composition 302 has a first region 304 having a first refractive index and a second region 306 having a second refractive index different from the first refractive index. As illustrated, the first region 304 is a component of a first layer 308 of material and the second region 306 is a component of a second layer 310 of material. The first and second layers 308, 310 are in contact with one another, though in alternative examples, such as are disclosed herein, the layers 308, 310 may be separate from one another, such as by an alternative material or composition. In various examples, the first region 304 is coextensive with the first layer 308 and the second region 306 is coextensive with the second region 310. As illustrated, the first and second layers 308, 310 define first and second major planes 312, 314, respectively, that are parallel with respect to one another.

As illustrated, both of the layers 308, 310 are silicone-containing compositions but each with different chemistries (e.g., curing chemistries), represented jointly by the composition 302. In examples where both layers are the composition 302, various properties of the composition 302 may be different between the two layers 308, 310, such as to provide different refractive indices, while still being a silicone-containing composition 302 as disclosed herein.

The layers 308, 310 can be secured with respect to one another according to a variety of methodologies known in the art. As illustrated, the layers 308, 310 have a dividing line 312 between the layers 308, 310. In such an example, the layers 308, 310 may be secured with respect to one another in a way that provides little or no mixing between the layers 308, 310. Such an arrangement may provide a relatively sharp change in the refractive index in the optical article 300 as a whole, such as may be utilized to promote an internal reflection of light passing through the optical article 300.

Figure 4:
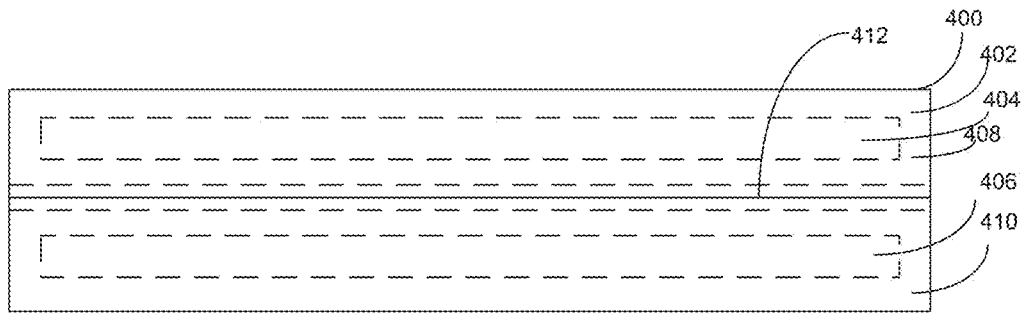
FIG. 4 is a side profile of a stylized optical article having a first and second layer.

FIG. 4 is a side profile of a stylized optical article 400 that includes a silicone-containing composition 402. The composition 402 has a first region 404 having a first refractive index and a second region 406 having a second refractive index different from the first refractive index. As illustrated, the first region 404 is a component of a first layer 408 of material and the second region 406 is a component of a second layer 410 of material.

In contrast with optical article 300, the layers 408, 410 of optical article 400 combine in a third region/layer 412 that is a combination of the first and second layers 408, 410. Such a third region 412 may be formed by applying heat or a solvent (e.g., a solvent having a higher boiling point than toluene, such as mesitylene and xylene) or otherwise mixing a portion of each of the individual layer 408, 410. Within the third region 412, the materials that make up the individual layers 408, 410 may be of variant concentrations with respect to one another, leading to a gradient within the third region 412. Such a gradient within the third region 412 may be regular or irregular depending on how the compositions of the first and second layers 408, 410 were mixed. The refractive index or indices within the third region 412 may be the same or somewhere in between the refractive index of the first and second layers 404, 406.

Figure 5:
FIG. 5 is a side profile of a stylized optical article having three layers.

FIG. 5 is a side profile of a stylized optical article 500 that includes a silicone-containing composition 502. The composition 502 has a first region 504 having a first refractive index, a second region 506 having a second refractive index different from the first refractive index, and a third region 508 having a third refractive index different from the first and second refractive indices. As illustrated, the first region 504 is a component of a first layer 510 of material, the second region 506 is a component of a second layer 512 of material, and the third region is a component of a third layer 514 of material.

The layers 510, 512, 514 may be secured with respect to one another according to the methodologies disclosed herein, and the regions 504, 506, 508 may relate to their respective layers 510, 512, 514 according to the disclosure herein. In various examples, the first, second and third regions 504, 506, 508 create a progressively developing gradient, wherein the first refractive index is less than the second refractive index, which is less than the third refractive index. In alternative examples, the gradient can shift within the composition 502, such as by making the second refractive index larger than either of the first and third refractive indices. The sandwiching of layers, as illustrated with respect to the layers 510, 512, 514, can be utilized throughout the optical article 500 with multiple additional layers.

Figure 6:
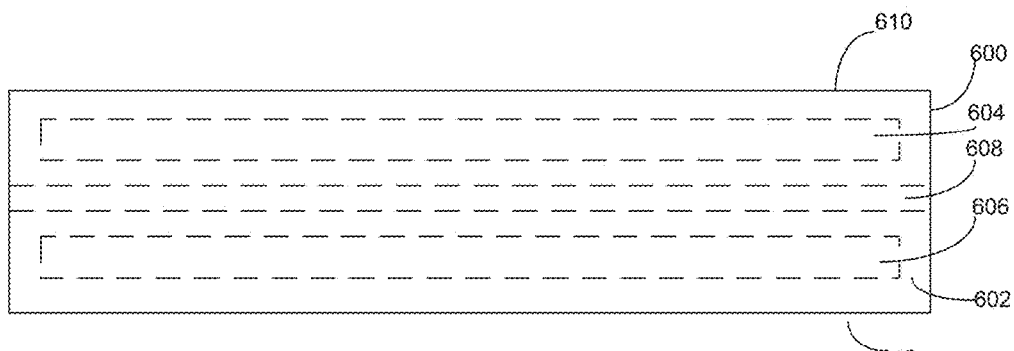
FIG. 6 is a side profile of a stylized optical article having a concentration gradient.

FIG. 6 is a side profile of a stylized optical article 600 that includes a silicone-containing composition 602. The composition 602 has a first region 604 having a first refractive index and a second region 606 having a second refractive index different from the first refractive index. The composition 600 further includes a gradient region 608 between the first and second regions 604, 606. The gradient region may include a continuous gradient. The continuous gradient may extend beyond the gradient region 608 as marked, such as by extending through the first and second regions 604, 606. In various examples, the gradient region 608 extends from a first major surface 610 of the optical article 600 to a second major surface 612 of the optical article 600. In such an example, the first and second regions 604, 606 may comprise a portion of the continuous gradient extending through the composition 602.

In some specific examples, the regions 104, 106 of the composition 102 (for the sake of brevity, composition 102 and related regions 104, 106 are referred to herein, such references should be understood to include some or all of the compositions and regions disclosed herein) include Ph-T-PhMe in one region and Ph-T-PhMe in the other region. In some examples, the two regions are in direct contact with one another. In some examples, one of the Ph-T-PhMe-containing regions is a high refractive index Ph-T-PhMe region. As used herein, the term "high refractive index" refers to refractive indices of from about about 1.5 to about 1.58, e.g., from about 1.55 to about 1.58 or from about 1.56 to about 1.58. In other examples, one of the Ph-T-PhMe layers is cured. In some examples, one of the Ph-T-PhMe regions has a thickness of from about 50 to about 100 microns (e.g., from about 50 to about 75 microns; from about 60 to about 90 microns; or from about 75 to about 100 microns). In other examples, one of the Ph-T-PhMe regions has a thickness of from about 0.3 to about 1 5 mm (e.g., from about 0.5 to about 1.3 mm; from about 1 to about 1.5 mm; or from about 0.75 to about 1.5 mm). In still other examples, one of the Ph-T-PhMe includes a phosphor.

In some examples, the regions 104, 106 of the composition 102 include Ph-T-PhMe in one region and Ph-T-PDMS in another region. In some examples, the two regions are in direct contact with one another. In some examples, the Ph-T-PhMe region is a high refractive index Ph-T-PhMe region. In some examples, the Ph-T-PhMe region has a thickness of from about 50 to about 100 microns (e.g., from about 50 to about 75 microns; from about 60 to about 90 microns; or from about 75 to about 100 microns). In other examples, the Ph-T-PDMS region has a thickness of from about 0.3 to about 1.5 mm (e g , from about 0.5 to about 1.3 mm; from about 1 to about 1.5 mm; or from about 0.75 to about 1.5 mm). In yet other examples, the Ph-T-PhMe region includes a phosphor.

In some examples, the regions 104, 106 of the composition 102 include Ph-T-PhMe in one region and Np-T-PhMe in another region. In some examples, the two regions are in direct contact with one another. In some examples, the Ph-T-PhMe region is a high refractive index Ph-T-PhMe region. In some examples, the Np-T-PhMe region is an ultra-high refractive index Np-T-PhMe region. As used herein, the term "ultra-high refractive index" refers to refractive indices greater than 1.58, e.g., greater than 1.65, greater than 1.75; from about 1.6 to about 2.5; from about 1.75 to about 2; or from about 1.65 to about 2. In other examples, the Ph-T-PhMe region has a thickness of from about 0.3 to about 1.5 mm (e.g., from about 0.5 to about 1.3 mm; from about 1 to about 1.5 mm; or from about 0.75 to about 1.5 mm). In other examples, the Np-T-PhMe region has a thickness of from about 50 to about 100 microns (e.g., from about 50 to about 75 microns; from about 60 to about 90 microns; or from about 75 to about 100 microns). In yet other examples, the Np-T-PhMe layer includes a phosphor.

Optical Assemblies

The optical assemblies disclosed herein may have various architectures. For example, the optical assembly may include only an optical device and an optical article, such as a layered polymeric structure acting as an encapsulant. Alternatively, the optical assembly itself may be understood to be an optical article that includes compositions having refractive index gradients as described above.

The optical assembly may be in various known applications, such as in photovoltaic panels and other optical energy-generating devices, optocouplers, optical networks and data transmission, instrument panels and switches, courtesy lighting, turn and stop signals, household appliances, VCR/DVD/stereo/audio/video devices, toys/games instrumentation, security equipment, switches, architectural lighting, signage (channel letters), machine vision, retail displays, emergency lighting, neon and bulb replacement, flashlights, accent lighting full color video, monochrome message boards, in traffic, rail, and aviation applications, in mobile phones, personal digital assistants (PDAs), digital cameras, lap tops, in medical instrumentation, bar code readers, color & money sensors, encoders, optical switches, fiber optic communication, and combinations thereof.

The optical devices can include coherent light sources, such as various lasers known in the art, as well as incoherent light sources, such as light emitting diodes (LED) and various types of light emitting diodes, including semiconductor LEDs, organic LEDs, polymer LEDs, quantum dot LEDs, infrared LEDs, visible light LEDs (including colored and white light), ultraviolet LEDs, and combinations thereof.

Figure 7:
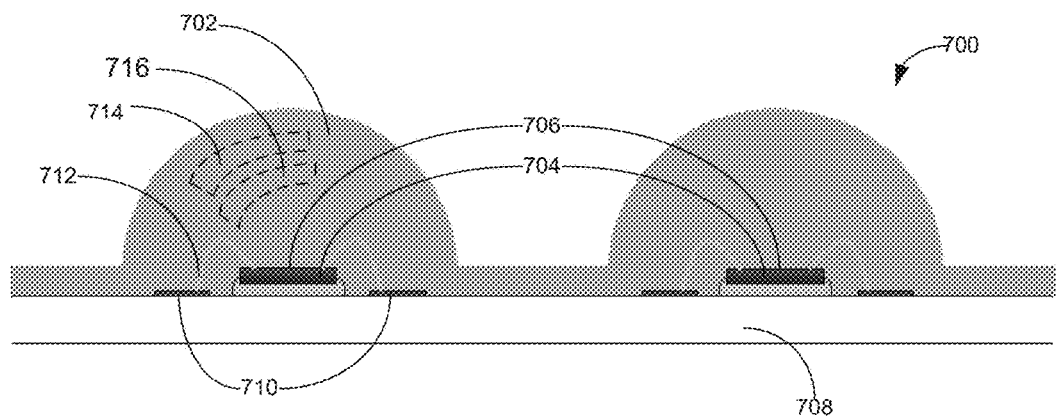
FIG. 7 is an abstract example of an optical assembly.

FIG. 7 is an abstract example of an optical assembly 700, such as a solid state light. The optical assembly includes an encapsulant 702 made, at least in part, from a silicon-containing composition having a gradient, such as any one of optical articles 100, 200, 300, 400, 500, 600. The encapsulant 702 encapsulates optical devices 704, such as an LED, each having an optical surface 706 and each positioned on a substrate 708. The encapsulant 702 can be in the form of a sheet. The sheet can be generally flat (such as in the optical assembly 800 below) or can be in the form of a lens or other generally non-flat configuration as shown with respect to the encapsulant 702.

In some embodiments, the light of the embodiments described herein are sheets that transmit all wavelengths of radiation, including ultraviolet (UV) radiation; visible light; and infrared (IR) radiation. In some embodiments, the encapsulant 702 transmits visible light, which includes light with wavelengths above 350 nm.

The optical device 704 is configured to emit light from the optical surface 706, such as generally orthogonal to the optical surface 706. The encapsulant 702 may be formed by hot-press and compression molding of the composition to the optical devices 704, as illustrated in a mold with dome-shape cavities. The optical assembly 700, as illustrated, further includes an electrode and/or electrical coupler 710 and wire connection 712 from the optical device 704. As illustrated, the composition of the encapsulant 702 is in direct contact with the optical device 704, such that no other compositions or materials are between the encapsulant 702 and the optical device 704 in at least one location. In various alternative examples, one or more additional materials may be disposed between the encapsulant 702 and the optical device 704.

The encapsulant 702 includes a gradient based on at least one of the optical articles disclosed herein. As illustrated, a first region 714, distal with respect to the optical surface 706, has a first refractive index and a second region 716, proximal with respect to the optical surface 706, has a second refractive index different from the first refractive index. In an example, because the refractive index of the optical surface 706 may be relatively high, the second refractive index may be higher than the first refractive index, such as according to various refractive index relationships disclosed herein.

Figure 8:
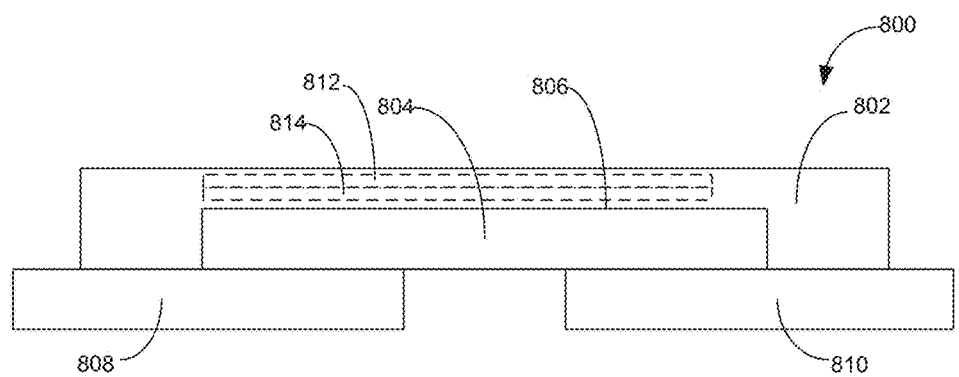
FIG. 8 is an abstract example of an optical assembly.

FIG. 8 is an abstract example of an optical assembly 800 that may be included in or that may form a solid state light. An encapsulant 802 covers an optical device 804, such as an LED. The encapsulant 802 is a solid silicone composition in the form of a light transmitting sheet. The optical device 804 has an optical surface 806 from which light is emitted during operation of the LED. It is noted that the optical assembly is not limited to solid state lights. In certain examples, the optical device 804 is an optical detector and the optical surface 806 receives rather than emits light. The optical device 804, as illustrated, is electrically coupled to and between electrodes (not pictured) respectively positioned on a first substrate 808 and a second substrate 810 at least partially isolated with respect to the first substrate 808.

As with optical assembly 700, the encapsulant 802 includes a gradient based on at least one of the optical articles disclosed herein. As illustrated, a first region 812, distal with respect to the optical surface 806, has a first refractive index and a second region 814, proximal with respect to the optical surface 806, has a second refractive index different from the first refractive index. In an example, because the refractive index of the optical surface 806 may be relatively high, the second refractive index may be higher than the first refractive index.

The optical assemblies 700, 800 are purely illustrative and non-limiting. Various solid state lights, optical detectors, and other optical assemblies may be formed with the materials disclosed herein according to various processes. The optical assemblies may be formed to various specifications and be utilized for any of a variety of purposes.

The optical assembly may also include one or more layers or components known in the art, different from the aforementioned encapsulants, as typically associated with optical assemblies. For example, the optical assembly may include one or more drivers, optics, heat sinks, housings, lenses, power supplies, fixtures, wires, electrodes, circuits, and the like.

The optical assembly also typically includes a substrate and/or a superstrate, also different from the optical article. The substrate may provide protection to a rear surface of the optical assembly while a superstrate may provide protection to a front surface of the optical assembly. The substrate and the superstrate may be the same or may be different and each may independently include any suitable material known in the art. The substrate and/or superstrate may be soft and flexible or may be rigid and stiff. Alternatively, the substrate and/or superstrate may include rigid and stiff segments while simultaneously including soft and flexible segments. The substrate and/or superstrate may be transparent to light, may be opaque, or may not transmit light (i.e., may be impervious to light). Typically, the superstrate transmits light. In one embodiment, the substrate and/or superstrate includes glass. In another embodiment, the substrate and/or superstrate includes metal foils, polyimides, ethylene-vinyl acetate copolymers, and/or organic fluoropolymers including, but not limited to, ethylene tetrafluoroethylene (ETFE), Tedlar®, polyester/Tedlar®, Tedlar®/polyester/Tedlar®, polyethylene terephthalate (PET) alone or coated with silicon and oxygenated materials (SiOx), and combinations thereof. In one embodiment, the substrate is further defined as a PET/SiOx-PET/Al substrate, wherein x has a value of from 1 to 4.

The substrate and/or superstrate may be load bearing or non-load bearing and may be included in any portion of the optical assembly. Typically, the substrate is load bearing. The substrate may be a "bottom layer" of the optical assembly that is typically positioned behind the light emitting diode and serves as mechanical support. Alternatively, the optical assembly may include a second or additional substrate and/or superstrate. The substrate may be the bottom layer of the optical assembly while a second substrate may be the top layer and function as the superstrate. Typically, the second substrate (e.g., a second substrate functioning as a superstrate is transparent to the light (e.g., visible, UV, and/or infrared light) and is positioned on top of the substrate. The second substrate may be used to protect the optical assembly from environmental conditions such as rain, snow, and heat. In one embodiment, the second substrate functions as a superstrate and is a rigid glass panel that is transparent to light and is used to protect the front surface of the optical assembly.

In addition, the optical assembly may also include one or more tie layers, also different from the optical article. The one or more tie layers may be disposed on the substrate to adhere the light emitting diode to the substrate. In one embodiment, the optical assembly does not include a substrate and does not include a tie layer. The tie layer may be transparent to UV, infrared, and/or visible light. However, the tie layer may be impermeable to light or opaque. The tie layer may be tacky and may be a gel, gum, liquid, paste, resin, or solid. In one embodiment, the tie layer is a film.

Moreover, the optical assembly may include a phosphor. The phosphor is not particularly limited and may include any known in the art. In one embodiment, the phosphor is made from a host material and an activator, such as copper-activated zinc sulfide and silver-activated zinc sulfide. Suitable but non-limiting host materials include oxides, nitrides and oxynitrides, sulfides, selenides, halides or silicates of zinc, cadmium, manganese, aluminum, silicon, or various rare earth metals. Additional suitable phosphors include, but are not limited to, $Zn_2SiO_4$:Mn (Willemite); ZnS:Ag+(Zn,Cd)S:Ag; ZnS:Ag+ZnS:Cu+$Y_2O_2S$:Eu; ZnO:Zn; KCl; ZnS:Ag,Cl or ZnS:Zn; $(KF,MgF_2)$:Mn; (Zn,Cd)S:Ag or (Zn,Cd)S:Cu; $Y_2O_2S$:Eu+$Fe_2O_3$, ZnS:Cu,Al; ZnS:Ag+Co-on-$Al_2O_3$; $(KF,MgF_2)$:Mn; (Zn,Cd)S:Cu,Cl; ZnS:Cu or ZnS:Cu,Ag; $MgF_2$:Mn; $(Zn,Mg)F_2$:Mn; $Zn_2SiO_4$:Mn,As; ZnS:Ag+(Zn,Cd)S:Cu; $Gd_2O_2S$:Tb; $Y_2O_2S$:Tb; $Y_3Al_5O_{12}$:Ce; $Y_2SiO_5$:Ce; $Y_3Al_5O_{12}$:Tb; ZnS:Ag,Al; ZnS:Ag; ZnS:Cu,Al or ZnS:Cu,Au,Al; (Zn,Cd)S:Cu,Cl+(Zn,Cd)S:Ag,Cl; $Y_2SiO_5$:Tb; $Y_2OS$:Tb; $Y_3(Al,Ga)_5O_{12}$:Ce; $Y_3(Al,Ga)_5O_{12}$:Tb; $InBO_3$:Tb; $InBO_3$:Eu; $InBO_3$:Tb+$InBO_3$:Eu; $InBO_3$:Tb+$InBO_3$:Eu+ZnS:Ag; $(Ba,Eu)Mg_2Al_{16}O_{27}$; (Ce,Tb)$MgAl_{11}O_{19}$; $BaMgAl_{10}O_{17}$:Eu,Mn; $BaMg_2Al_{16}O_{27}$:Eu(II); $BaMgAl_{10}O_{17}$:Eu,Mn; $BaMg_2Al_{16}O_{27}$:Eu(II),Mn(II); $Ce_{0.67}Tb_{0.33}MgAl_{11}O_{19}$:Ce,Tb; $Zn_2SiO_4$:Mn,$Sb_2O_3$; $CaSiO_3$:Pb,Mn; $CaWO_4$ (Scheelite); $CaWO_4$:Pb; $MgWO_4$; $(Sr,Eu,Ba,Ca)_5(PO_4)_3Cl$; $Sr_5Cl(PO_4)_3$:Eu(II); $(Ca,Sr,Ba)_3(PO_4)_2Cl_2$:Eu; $(Sr,Ca,Ba)_{10}(PO_4)_6Cl_2$:Eu; $Sr_2P_2O_7$:Sn(II); $Sr_6P_5BO_{20}$:Eu; $Ca_5F(PO_4)_3$:Sb; $(Ba,Ti)_2P_2O_7$:Ti; $3Sr_3(PO_4)_2.SrF_2$:Sb,Mn; $Sr_5F(PO_4)_3$:Sb,Mn; $Sr_5F(PO_4)_3$:Sb,Mn; $LaPO_4$:Ce,Tb; $(La,Ce,Tb)PO_4$;$(La,Ce,Tb)PO_4$:Ce,Tb; $Ca_3(PO_4)_2.CaF_2$:Ce,Mn; $(Ca,Zn,Mg)_3(PO_4)_2$:Sn; $(Zn,Sr)_3(PO_4)_2$:Mn; $(Sr,Mg)_3(PO_4)_2$:Sn; $(Sr,Mg)_3(PO_4)_2$:Sn(II); $Ca_5F(PO_4)_3$:Sb,Mn; $Ca_5(F,Cl)(PO_4)_3$:Sb,Mn; $(Y,Eu)_2O_3$; $Y_2O_3$:Eu(III); $Mg_4(F)GeO_6$:Mn; $Mg_4(F)(Ge,Sn)O_6$:Mn; $Y(P,V)O_4$:Eu; $YVO_4$:Eu; $Y_2O_2S$:Eu; $3.5MgO.0.5MgF_2.GeO_2$:Mn; $Mg_5As_2O_{11}$:Mn; $SrAl_2O_7$:Pb; $LaMgAl_{11}O_{19}$:Ce; $LaPO_4$:Ce; $SrAl_{12}O_{19}$:Ce; $BaSi_2O_5$:Pb; $SrFB_2O_3$:Eu(II); $SrB_4O_7$:Eu; $Sr_2MgSi_2O_7$:Pb; $MgGa_2O_4$:Mn(II); $Gd_2O_2S$:Tb; $Gd_2O_2S$:Eu; $Gd_2O_2S$:Pr; $Gd_2O_2S$:Pr,Ce,F; $Y_2O_2S$:Tb; $Y_2O_2S$:Eu; $Y_2O_2S$:Pr; Zn(0.5)Cd(0.4)S:Ag; Zn(0.4)Cd(0.6)S:Ag; $CdWO_4$; $CaWO_4$; $MgWO_4$; $Y_2SiO_5$:Ce; $YAlO_3$:Ce; $Y_3Al_5O_{12}$:Ce; $Y_3(Al,Ga)_5O_{12}$:Ce; CdS:In; ZnO:Ga; ZnO:Zn; (Zn,Cd)S:Cu,Al; ZnS:Cu,Al,Au; ZnCdS:Ag,Cu; ZnS:Ag; anthracene, EJ-212, $Zn_2SiO_4$:Mn; ZnS:Cu; NaI:Tl; CsI:Tl; LiF/ZnS:Ag; LiF/ZnSCu,Al,Au, and combinations thereof.

The phosphor may be present in any portion of the optical assembly. In one embodiment, the phosphor is present in a lens. In another embodiment, the phosphor is present in a layer or in one or more of the regions described above; that is, in the silicone-containing composition itself, as described in greater detail below. The phosphor may be present in the optical article.

The optical article, such as in the form of a light transmitting sheet, is formed using methodologies that include the step of applying a silicone-containing composition to a surface. In various examples, the surface is one of an optical surface of an optical device and the resultant light transmitting sheet is formed in situ as part of the assembly of an optical assembly. In such examples, the silicone-containing composition can be applied on the optical surface in a variety of solid forms, as disclosed in detail below. In various additional examples, the light transmitting sheet is formed without respect to an optical assembly. In such examples, the light transmitting sheet can be formed from the various silicone-containing compositions disclosed below, following which the light transmitting sheet may subsequently be applied in a variety of circumstances in which a light transmitting sheet may be utilized, including but not necessarily limited to optical assemblies.

The silicone-containing composition is a solid (hereinafter described as the "solid composition"). The solid composition is "solid," as understood in the art. For example, the solid composition has structural rigidity, resists to changes of shape or volume, and is not a liquid or a gel. In one example, the solid composition is a film. Alternatively, the solid composition may be a pellet, spheroid, ribbon, sheet, cube, powder (e.g., a powder having an average particle size of not more than 500 μm, including a powder having an average particle size of from about 5 to about 500 μm; from about 10 to about 100 μm; from about 10 to about 50 μm; from about 30 to about 100 μm; from about 50 to about 100 μm; from about 50 to about 250 μm; from about 100 to about 500 μm; from about 150 to about 300 μm; or from about 250 to about 500 μm), etc. The dimensions of the solid composition are not particularly limited. Said differently, the film, sheet, pellet, etc. may be of any dimensions. In various embodiments, the solid composition is as described in described in U.S. Provisional Patent Application Ser. No. 61/581,852, filed Dec. 30, 2011; PCT Application No. PCT/US2012/071011, filed Dec. 30, 2012; U.S. Provisional Patent Application Ser. No. 61/586,988, filed Jan. 16, 2012; and PCT Application No. PCT/US2013/021707, filed Jan. 16, 2013, all of which are hereby expressly incorporated herein by reference.

The solid composition typically has two glass transition temperatures ($T_g$), one associated with soft block components and one associated with hard block components. As used herein, $T_g$ is assessed using a differential scanning calorimeter (DSC). For example, a TA Instruments Q2000 (DSC) may be used to measure the glass transition ($T_g$). Typically a 10 mg sample is heated at 20° C./min using helium as a purge gas (25 mL/min). The $T_g$ is typically calculated using the step midpoint at half extrapolated tangents. Typically, the higher of the two glass transition temperatures of the solid composition is from −30 to 200, from 0 to 130, from 25 to 150, or from 40 to 120° C. At temperatures above this higher of the two glass transition temperatures, the solid composition softens and flow. In various embodiments, the lower of the two glass transition temperatures of the solid composition is from −130° C. to 25° C., from −130° C. to 0° C., or from −130° C. to −10° C.

Compositions

The optical articles of the embodiments described herein include or are made up of a silicone-containing composition. The silicone-containing composition includes at least one of a resin-linear composition. In some specific examples, resin-linear compositions contain organosiloxane block copolymers containing:

40 to 90 mole percent disiloxy units of the formula 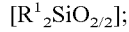;
10 to 60 mole percent trisiloxy units of the formula 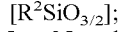;
0.5 to 25 mole percent silanol groups [≡SiOH];

wherein:
$R^1$ is independently a $C_1$ to $C_{30}$ hydrocarbyl;
$R^2$ is independently a $C_1$ to $C_{20}$ hydrocarbyl;
wherein:
the disiloxy units [$R^1{}_2SiO_{2/2}$] are arranged in linear blocks having an average of from 10 to 400 disiloxy units [$R^1{}_2SiO_{2/2}$] per linear block,
the trisiloxy units [$R^2SiO_{3/2}$] are arranged in non-linear blocks having a molecular weight of at least 500 g/mole, at least 30% of the non-linear blocks are crosslinked with each other and are predominately aggregated together in nano-domains, each linear block is linked to at least one non-linear block; and
the organosiloxane block copolymer has a weight average molecular weight of at least 20,000 g/mole, and is a solid at 25° C.

The organosiloxane block copolymer of the examples described herein are referred to as "resin-linear" organosiloxane block copolymers and include siloxy units independently selected from ($R_3SiO_{1/2}$), ($R_2SiO_{2/2}$), ($RSiO_{3/2}$), or ($SiO_{4/2}$) siloxy units, where R may be any organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes typically contain mostly D, or ($R_2SiO_{2/2}$) siloxy units, which results in polydiorganosiloxanes that are fluids of varying viscosities, depending on the "degree of polymerization" or DP as indicated by the number of D units in the polydiorganosiloxane. "Linear" organopolysiloxanes typically have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin". Increasing the amount of T or Q siloxy units in an organopolysiloxane typically results in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" described herein refer to organopolysiloxanes containing D and T siloxy units, where the D units (i.e., [$R^1{}_2SiO_{2/2}$] units) are primarily bonded together to form polymeric chains having, in some embodiments, an average of from 10 to 400 D units (e.g., about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred to herein as "linear blocks".

The T units (i.e., [$R^2SiO_{3/2}$]) are primarily bonded to each other to form branched polymeric chains, which are referred to as "non-linear blocks". In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units [$R^1_2SiO_{2/2}$] are arranged in linear blocks having an average of from 10 to 400 disiloxy units [$R^1_2SiO_{2/2}$] per linear block (e.g., about 10 to about 400 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units [$R^2SiO_{3/2}$] are arranged in non-linear blocks having a molecular weight of at least 500 g/mole and at least 30% of the non-linear blocks are crosslinked with each other.

The aforementioned formulas may be alternatively described as [$R^1_2SiO_{2/2}$]$_a$[$R^2SiO_{3/2}$]$_b$ where the subscripts a and b represent the mole fractions of the siloxy units in the organosiloxane block copolymer. In these formulas, a may vary from 0.4 to 0.9, alternatively from 0.5 to 0.9, and alternatively from 0.6 to 0.9. Also in these formulas, b can vary from 0.1 to 0.6, alternatively from 0.1 to 0.5 and alternatively from 0.1 to 0.4.

$R^1$ in the above disiloxy unit formula is independently a $C_1$ to $C_{30}$ hydrocarbyl. The hydrocarbon group may independently be an alkyl, aryl, or alkylaryl group. As used herein, hydrocarbyl also includes halogen substituted hydrocarbyls, where the halogen may be chlorine, fluorine, bromine or combinations thereof. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

Each $R^2$ in the above trisiloxy unit formula is independently a $C_1$ to $C_{20}$ hydrocarbyl. As used herein, hydrocarbyl also includes halogen substituted hydrocarbyls, where the halogen may be chlorine, fluorine, bromine or combinations thereof. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The organosiloxane block copolymer may include additional siloxy units, such as M siloxy units, Q siloxy units, other unique D or T siloxy units (e.g., having a organic groups other than $R^1$ or $R^2$), so long as the organosiloxane block copolymer includes the mole fractions of the disiloxy and trisiloxy units as described above. In other words, the sum of the mole fractions as designated by subscripts a and b, do not necessarily have to sum to one. The sum of a+b may be less than one to account for amounts of other siloxy units that may be present in the organosiloxane block copolymer. For example, the sum of a+b may be greater than 0.6, greater than 0.7, greater than 0.8, greater than 0.9, greater than 0.95, or greater than 0.98 or 0.99.

In one example, the organosiloxane block copolymer consists essentially of the disiloxy units of the formula $R^1_2SiO_{2/2}$ and trisiloxy units of the formula $R^2SiO_{3/2}$, in the aforementioned weight percentages, while also including 0.5 to 25 mole percent silanol groups [≡SiOH], wherein $R^1$ and $R^2$ are as described above. Thus, in this example, the sum of a+b (when using mole fractions to represent the amount of disiloxy and trisiloxy units in the copolymer) is greater than 0.95, alternatively greater than 0.98. Moreover, in this example, the terminology "consisting essentially of" describes that the organosiloxane block copolymer is free of other siloxane units not described herein.

The formula [$R^1_2SiO_{2/2}$]$_a$[$R^2SiO_{3/2}$]$_b$, and related formulae using mole fractions, as described herein, do not limit the structural ordering of the disiloxy $R^1_2SiO_{2/2}$ and trisiloxy $R^2SiO_{3/2}$ units in the organosiloxane block copolymer. Rather, these formulae provide a non-limiting notation to describe the relative amounts of the two units in the organosiloxane block copolymer, as per the mole fractions described above via the subscripts a and b. The mole fractions of the various siloxy units in the organosiloxane block copolymer, as well as the silanol content, may be determined by $^{29}$Si NMR techniques.

In some embodiments, the organosiloxane block copolymers described herein comprise 40 to 90 mole percent disiloxy units of the formula [$R^1_2SiO_{2/2}$], e.g., 50 to 90 mole percent disiloxy units of the formula [$R^1_2SiO_{2/2}$]; 60 to 90 mole percent disiloxy units of the formula [$R^1_2SiO_{2/2}$]; 65 to 90 mole percent disiloxy units of the formula [$R^1_2SiO_{2/2}$]; 70 to 90 mole percent disiloxy units of the formula [$R^1_2SiO_{2/2}$]; or 80 to 90 mole percent disiloxy units of the formula [$R^1_2SiO_{2/2}$]; 40 to 80 mole percent disiloxy units of the formula [$R^1_2SiO_{2/2}$]; 40 to 70 mole percent disiloxy units of the formula [$R^1_2SiO_{2/2}$]; 40 to 60 mole percent disiloxy units of the formula [$R^1_2SiO_{2/2}$]; 40 to 50 mole percent disiloxy units of the formula [$R^1_2SiO_{2/2}$]; 50 to 80 mole percent disiloxy units of the formula [$R^1_2SiO_{2/2}$]; 50 to 70 mole percent disiloxy units of the formula [$R^1_2SiO_{2/2}$]; 50 to 60 mole percent disiloxy units of the formula [$R^1_2SiO_{2/2}$]; 60 to 80 mole percent disiloxy units of the formula [$R^1_2SiO_{2/2}$]; 60 to 70 mole percent disiloxy units of the formula [$R^1_2SiO_{2/2}$]; or 70 to 80 mole percent disiloxy units of the formula [$R^1_2SiO_{2/2}$].

In some embodiments, the organosiloxane block copolymers described herein comprise 10 to 60 mole percent trisiloxy units of the formula [$R^2SiO_{3/2}$], e.g., 10 to 20 mole percent trisiloxy units of the formula [$R^2SiO_{3/2}$]; 10 to 30 mole percent trisiloxy units of the formula [$R^2SiO_{3/2}$]; 10 to 35 mole percent trisiloxy units of the formula [$R^2SiO_{3/2}$]; 10 to 40 mole percent trisiloxy units of the formula [$R^2SiO_{3/2}$]; 10 to 50 mole percent trisiloxy units of the formula [$R^2SiO_{3/2}$]; 20 to 30 mole percent trisiloxy units of the formula [$R^2SiO_{3/2}$]; 20 to 35 mole percent trisiloxy units of the formula [$R^2SiO_{3/2}$]; 20 to 40 mole percent trisiloxy units of the formula [$R^2SiO_{3/2}$]; 20 to 50 mole percent trisiloxy units of the formula [$R^2SiO_{3/2}$]; 20 to 60 mole percent trisiloxy units of the formula [$R^2SiO_{3/2}$]; 30 to 40 mole percent trisiloxy units of the formula [$R^2SiO_{3/2}$]; 30 to 50 mole percent trisiloxy units of the formula [$R^2SiO_{3/2}$]; 30 to 60 mole percent trisiloxy units of the formula [$R^2SiO_{3/2}$]; 40 to 50 mole percent trisiloxy units of the formula [$R^2SiO_{3/2}$]; or 40 to 60 mole percent trisiloxy units of the formula [$R^2SiO_{3/2}$].

In some embodiments, the organosiloxane block copolymers described herein comprise 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or 20 to 25 mole percent). The silanol groups present on the resin component of the organosiloxane block copolymer may allow the organosiloxane block copolymer to further react or cure at elevated temperatures or to cross-link. The crosslinking of the non-linear blocks may be accomplished via a variety of chemical mechanisms and/or moieties. For example, crosslinking of non-linear blocks within the organosiloxane block copolymer may result from the condensation of residual silanol groups present in the non-linear blocks of the organosiloxane block copolymer.

In some embodiments, the disiloxy units [$R^1_2SiO_{2/2}$] in the organosiloxane block copolymers described herein are arranged in linear blocks having an average of 10 to 400 disiloxy units, e.g., about 10 to about 400 disiloxy units; about 10 to about 300 disiloxy units; about 10 to about 200 disiloxy units; about 10 to about 100 disiloxy units; about 50 to about 400 disiloxy units; about 100 to about 400 disiloxy units; about 150 to about 400 disiloxy units; about 200 to about 400 disiloxy units; about 300 to about 400 disiloxy units; about 50 to about 300 disiloxy units; about 100 to about 300 disiloxy units; about 150 to about 300 disiloxy units; about 200 to about 300 disiloxy units; about 100 to about 150 disiloxy units, about 115 to about 125 disiloxy units, about 90 to about 170 disiloxy units or about 110 to about 140 disiloxy units).

In some embodiments, the non-linear blocks in the organosiloxane block copolymers described herein have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to about 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks in the organosiloxane block copolymers described herein are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

In some embodiments, the organosiloxane block copolymers described herein have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers described herein have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In other embodiments, the weight average molecular weight of the organosiloxane block copolymers described herein is from 40,000 to 100,000, from 50,000 to 90,000, from 60,000 to 80,000, from 60,000 to 70,000, of from 100,000 to 500,000, of from 150,000 to 450,000, of from 200,000 to 400,000, of from 250,000 to 350,000, or from 250,000 to 300,000, g/mole. In still other embodiments, the organosiloxane block copolymer has a weight average molecular weight of from 40,000 to 60,000, from 45,000 to 55,000, or about 50,000, g/mole.

In some embodiments, the organosiloxane block copolymers described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains" As used herein, "predominately aggregated" means the majority of the non-linear blocks of the organosiloxane block copolymer are found in certain regions of the solid composition, described herein as "nano-domains". As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, cylindrically shaped, tubular shaped, and in some instances lamellar shaped.

In a further embodiment, the solid organosiloxane block copolymers as described above contain a first phase and an incompatible second phase, the first phase containing predominately the disiloxy units $[R^1_2SiO_{2/2}]$ as defined above, the second phase containing predominately the trisiloxy units $[R^2SiO_{3/2}]$ as defined above, the non-linear blocks being sufficiently aggregated into nano-domains which are incompatible with the first phase.

When solid compositions are formed from curable compositions of the organosiloxane block copolymers described herein, which, in some embodiments also contain an organosiloxane resin (e.g., free resin that is not part of the block copolymer), the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

The solid composition of this disclosure may include phase separated "soft" and "hard" segments resulting from blocks of linear D units and aggregates of blocks of non-linear T units, respectively. These respective soft and hard segments may be determined or inferred by differing glass transition temperatures ($T_g$). Thus a linear segment may be described as a "soft" segment typically having a low $T_g$, for example less than 25° C., alternatively less than 0° C., or alternatively even less than −20° C. The linear segments typically maintain "fluid" like behavior in a variety of conditions. Conversely, non-linear blocks may be described as "hard segments" having higher $T_g$, values, for example greater than 30° C., alternatively greater than 40° C., or alternatively even greater than 50° C.

The advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer the significant advantage of being "re-processable" in conjunction with the benefits typically associated with silicones, such as; hydrophobicity, high temperature stability, moisture/UV resistance.

In one embodiment, a linear soft block siloxane unit, e.g., with a degree of polymerization (dp)>2 (e.g., dp>10; dp>50; dp>100; dp>150; or dp from about 2 to about 150; dp from about 50 to about 150; or dp from about 70 to about 150) is grafted to a linear or resinous "hard block" siloxane unit with a glass transition above room temperature. In a related embodiment, the organosiloxane block copolymer (e.g., silanol terminated organosiloxane block copolymer) is reacted with a silane, such as methyl triacetoxy silane and/or methyl trioxime silane, followed by reaction with a silanol functional phenyl silsesquioxane resin. In still other embodiments, the organosiloxane block copolymer includes one or more soft blocks (e.g., blocks with glass transition<25° C.) and one or more linear siloxane "pre-polymer" blocks that, in some embodiments, include aryl groups as side chains (e.g., poly(phenyl methyl siloxane). In another embodiment, the organosiloxane block copolymer includes PhMe-D contents >20 mole % (e.g., >30 mole %; >40 mole %; >50 mole %; or from about 20 to about 50 mole %; about 30 to about 50 mole %; or from about 20 to about 30 mole %); PhMe-D dp>2 (e.g., dp>10; dp>50; dp>100; dp>150; or dp from about 2 to about 150; dp from about 50 to about 150; or dp from about 70 to about 150); and/or $Ph_2$-D/$Me_2$-D>20 mole % (e.g., >30 mole %; >40 mole %; >50 mole %; or from about 20 to about 50 mole %; about 30 to about 50 mole %; or from about 20 to about 30 mole %), where the mole ratio of $Ph_2$-D/$Me_2$-D is about 3/7. In some embodiments, the $Ph_2$-D/$Me_2$-D mole ratio is from about 1/4 to about 1/2, e.g., about 3/7 to about 3/8. In still other embodiments, the organosiloxane block copolymer includes one or more hard blocks (e.g., blocks with glass transition>25° C.) and one or more linear or resinous siloxanes, for example, phenyl silsesquioxane resins, which may be used to form non-tacky films.

In some embodiments, the solid compositions, which include a resin-linear organosiloxane block copolymer, also contain a superbase catalyst. See, e.g., PCT Appl. No. PCT/US2012/069701, filed Dec. 14, 2012; and U.S. Provisional Appl. No. 61/570,477, filed Dec. 14, 2012, the entireties of which are incorporated by reference as if fully set forth herein. The term "superbase" and "superbase catalyst" are used herein interchangeably. In some embodiments, solid compositions comprising a superbase catalyst exhibit enhanced cure rates, improved mechanical strength, and improved thermal stability over similar compositions without the superbase catalyst.

The term "superbase" is used herein refers to compounds having a very high basicity, such as lithium diisopropylamide. The term "superbase" also encompasses bases resulting from a mixing of two (or more) bases leading to new basic species possessing new properties. The term "superbase" does not necessarily mean a base that is thermodynamically and/or kinetically stronger than another. Instead, in some embodiments, it means that a basic reagent is created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene.

Non-limiting examples of superbases include organic superbases, organometallic superbases, and inorganic superbases.

Organic superbases include, but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase catalyst is an amidine compound.

In some embodiments, the term "superbase" refers to organic superbases having at least two nitrogen atoms and a $pK_b$ of from about 0.5 to about 11, as measured in water. For example, the $pK_b$ is from about 0.5 to about 10, from about 1 to about 5, from about 6 to about 11, from about 3 to about 5, from about 0.5 to about 3 or from about 2 to about 5, as measured in water. In terms of $pK_a$, in some embodiments, superbases have a $pK_a$ of from about 3 to about 13.5, as measured in water. For example, the $pK_a$ is from about 5 to about 10, from about 5 to about 10, from about 8 to about 13.5, from about 6 to about 8, from about 10 to about 12 or from about 9 to about 12, as measured in water. For example, 1,4-diazabicyclo[2.2.2]octane, also known as DABCO, has a pKa of 2.97 and 8.82 (since it contains two nitrogens); and 1,8-diazabicyclo[5.4.0]undec-7-ene, also known as DBU, has a pKa of about 12. See, e.g., http://evans.harvard.edu/pdf/evans_pka_table.pdf.

Organometallic superbases include, but are not limited to, organolithium and organomagnesium (Grignard reagent) compounds. In some embodiments, the organometallic superbases are hindered to the extent necessary to make them non-nucleophilic.

Superbases also include mixtures of organic, organometallic, and/or inorganic superbases. A non-limited example of such mixed superbases is the Schlosser base (or Lochmann-Schlosser base), which is the combination of n-butyllithium and potassium tert-butoxide. The combination of n-butyllithium and potassium tert-butoxide form a mixed aggregate of greater reactivity than either reagent alone and with distinctly different properties in comparison to tert-butylpotassium.

Inorganic superbases include salt-like compounds with small, highly charged anions. Non-limiting examples of inorganic superbases include lithium nitride and alkali- and alkali earth metal hydrides including potassium hydride and sodium hydride. Such species are insoluble in all solvents owing to the strong cation-anion interactions, but the surfaces of these materials are highly reactive and slurries can be used.

In certain embodiments of the present invention, the superbase catalyst is an organic superbase, such as any of the organic superbases as described above or known in the art.

In a further embodiment, the superbase catalyst comprises:
1,8-Diazabicyclo[5.4.0]undec-7-ene (DRU), (CAS #6674-22-2)
1,5,7-Triazabicyclo[4.4.0]dec-5-ene (TBD), (CAS #5807-14-7)
1,4-Diazabicyclo[2.2.2]octane (DABCO), (CAS #280-57-9)
1,1,3,3-Tetramethylguanidine (TMG), (CAS #80-70-6)
1,5-Diazabicyclo[4.3.0]-5-nonene (DBN), (CAS #3001-72-7)
7-Methyl-1,5,7-triazabicyclo[4.4.0]dec-5-ene (MTBD) (CAS #84030-20-6)
or combinations thereof.
The structures for each of these are shown below:

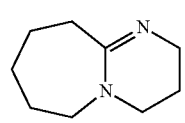

DBU

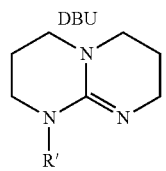

TBD (when R' = H)
MTBD (when R' = CH$_3$)

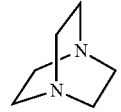

DABCO

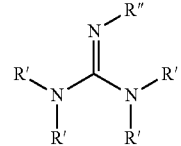

TMG (when R' = CH$_3$ and R" = H)

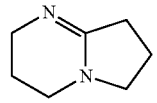

DBN

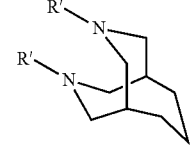

Bispidine (when R' = H)

where each R' is the same or different and is hydrogen or $C_1$-$C_5$ alkyl; and R" is hydrogen or $C_1$-$C_5$ alkyl. As used herein, the term "$C_1$-$C_5$ alkyl" refers broadly to a straight or branched chain saturated hydrocarbon radical. Examples of alkyl groups include, but are not limited to, straight chained alkyl groups including methyl, ethyl, n-propyl, n-butyl; and branched alkyl groups including isopropyl, tert-butyl, isoamyl, neopentyl, and the like. In some embodiments, the hydrocarbon radical is methyl.

The amount of the superbase catalyst in the solid compositions may vary and is not limiting. Typically, the amount added is a catalytically effective amount, which may vary depending on the superbase selected, as well as the concentration of residual silanol groups in the linear-resin copolymer composition, especially the amount of residual silanol groups on the resin components, and particularly the silanol amount on the "free resin" components in the composition. The amount of superbase catalyst is typically measured in parts per million (ppm) in the solid composition. In particular, the catalyst level is calculated in regard to copolymer solids. The amount of superbase catalyst added to the curable compositions may range from 0.1 to 1,000 ppm, alternatively from 1 to 500 ppm, or alternatively from 10 to 100 ppm, as based on the resin-linear block copolymer content (by weight) present in the solid compositions. For convenience for measuring and adding to the present compositions, the superbase catalyst may be diluted in an organic solvent before adding to the solid compositions. Typically, the superbase in diluted in the same organic solvent as used in the curable compositions.

In some embodiments, the superbase, in its broadest sense, may be considered a silanol condensation enhancing agent and may act as a condensation catalyst. In some embodiments, the silanol condensation enhancing agent may substantially reside in the phase separated resin rich phase and enhances silanol condensation in that phase, thereby reducing the mole % of reactive silanol groups in that phase. While not wishing to be bound by theory, it is possible that the superbase interacts with acidic SiOH groups of the resin residing in the phase separated resin rich phase. In some embodiments, the silanol condensation enhancing agent will be more likely to reside in the phase separated resin rich phase when the silanol condensation enhancing agent is more compatible (e.g., soluble) with that phase than, e.g., in the organosiloxane block copolymer-rich phase, and less likely to reside in the phase separated resin rich phase when the silanol condensation enhancing agent is less compatible with phase separated resin rich phase. In some embodiments, the mole % of reactive silanol groups in the phase separated resin rich phase is reduced by about 25%, e.g., by about 35%, by about 45%, by about 55%, by about 65%, by about 75%, by about 85%, or by about 95% relative to the mole % reactive silanol groups that would be present in the phase separated resin rich phase if the superbase were not present. In some embodiments, the mole % of reactive silanol groups in the phase separated resin rich phase is reduced from about 25% to about 95%, e.g., from about 25% to about 55%, from about 25% to about 75%, from about 35% to about 75%, from about 55% to about 95% or from about 55% to about 85% relative to the mole % reactive silanol groups that would be present in the phase separated resin rich phase if the superbase were not present.

In some embodiments, the solid compositions, which include a resin-linear organosiloxane block copolymer, also contain a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein. A stabilizer is added to the resin-linear organosiloxane block copolymers, as described above, to improve shelf stability and/or other physical properties of solid compositions containing the organosiloxane block copolymers. The stabilizer may be selected from an alkaline earth metal salt, a metal chelate, a boron compound, a silicon-containing small molecule or combinations thereof.

Although not wishing to be bound by any theory, the stabilizer component may behave as a condensation catalyst. For example, treatment with a salt such as calcium chloride or catalysts like metal chelates (e.g., magnesium acetylacetonate or Al(acac)$_3$) during the synthesis (e.g., at the end of synthesis) of the resin-linear organosiloxane block copolymers described herein, greatly increases the stability of the product. This is surprising and unexpected, since catalysts would be expected to reduce shelf stability of the silanol functional copolymers. However, while not being bound by theory, it is possible that, in some cases, the stabilizers may be preferentially soluble in the phase separated resin-rich phase and enhance condensation of the silanol groups present in this phase. Since this phase (i.e., the resin-rich phase) mainly contains residual "free resin", condensation of this phase can subsequently increase the cure temperature of the matrix containing the resin-linear block copolymers. For example, in the absence of the stabilizers described herein, a typical resin-linear material with elastomeric behavior (e.g., based on 20 mole % Phenyl-silsesquioxane resin and 184 dp polydimethylsiloxane, also known as "PDMS"), will have a flow onset around 80° C. followed by further condensation cure around 120° C. from residual silanol groups residing on the resin blocks, resulting in a material with tensile strength from 2-5 MPa and elongation at break from 200-600%. The same resin-linear material comprising a stabilizer will have its cure temperature significantly extended from 120 to 180° C.

In sum, in some embodiments, the stabilizer, in its broadest sense, may be considered a silanol condensation enhancing agent (i.e., a condensation catalyst). In some embodiments, the silanol condensation enhancing agent may substantially reside in the phase separated resin rich phase and enhances silanol condensation in that phase, thereby reducing the mole % of reactive silanol groups in that phase. In some embodiments, the silanol condensation enhancing agent will be more likely to reside in the phase separated resin rich phase when the silanol condensation enhancing agent is more compatible (e.g., soluble) with that phase than, e.g., in the organosiloxane block copolymer-rich phase, and less likely to reside in the phase separated resin rich phase when the silanol condensation enhancing agent is less compatible with phase separated resin rich phase. In some embodiments, the mole % of reactive silanol groups in the phase separated resin rich phase is reduced by about 25%, e.g., by about 35%, by about 45%, by about 55%, by about 65%, by about 75%, by about 85%, or by about 95% relative to the mole % reactive silanol groups that would be present in the phase separated resin rich phase if the stabilizer were not present. In some embodiments, the mole % of reactive silanol groups in the phase separated resin rich phase is reduced from about 25% to about 95%, e.g., from about 25% to about 55%, from about 25% to about 75%, from about 35% to about 75%, from about 55% to about 95% or from about 55% to about 85% relative to the mole % reactive silanol groups that would be present in the phase separated resin rich phase if the stabilizer were not present.

When present, the stabilizer is combined with the organosiloxane block copolymer. The method by which they are combined may vary and is not limiting, but typically the stabilizer is added to the resin-linear organosiloxane block copolymer or a composition containing the block copolymer. Alternatively, curable compositions containing the two components may be prepared.

In one embodiment, the stabilizer comprises an alkaline earth metal salt. As used herein the term "alkaline earth metal salt" includes, but is not limited to, salts of magnesium and calcium. Non-limiting examples of salts of magnesium include magnesium chloride. Non-limiting examples of salts of calcium include calcium chloride. For example, calcium chloride enhances the stability of organic solutions of resin-linear organosiloxane block copolymers. The enhanced stability associated with alkaline earth metal salt, as well as or the other stabilizers disclosed herein, may be assessed by monitoring the time needed to gel a solution of the resin-linear organosiloxane block copolymer at slightly elevated temperatures (such as 40° C., see examples for further details). The amount of the alkaline earth metal salt combined with the resin-linear organosiloxane block copolymer may vary, but typically, 1 to 100, alternatively 5 to 50, or alternatively 10 to 25 parts by weight of the alkaline earth metal salt is added for every 100 parts by weight of the resin-linear organosiloxane block copolymer described herein.

In another embodiment, the stabilizer comprises a metal chelate such as a metal acetylacetonate (acac). Representative metal acetylacetonate complexes suitable as a stabilizer include, but are not limited to, aluminum, lithium, vanadium, nickel, zirconium, manganese, calcium, and magnesium acetylacetonate complexes. The amount of the metal chelate combined with the resin-linear organosiloxane block copolymer may vary, but typically the amounts are selected based on providing a certain metal concentration in the compositions containing the resin-linear organosiloxane block copolymer. The metal concentrations in the compositions may be expressed in parts per million (ppm). Typically the metal concentrations in the compositions containing the resin-linear organosiloxane block copolymer varies from 1 to 1000 ppm, alternatively 10 to 500 ppm, 100 to 400 ppm, 50 to 300 ppm, 50 to 250 ppm, 50 to 100 ppm, 100 to 250 ppm, 150 to 250 ppm, 150 to 200 ppm or alternatively from 200 to 300 ppm.

In other embodiments, the stabilizer comprises a boron compound. In some embodiments, the boron compound comprises a derivative of boric acid (i.e., derivatives of $B(OH)_3$), compounds that contain B—OH units, or any boron compounds known to affect silanol condensation reactions (e.g., boron nitride and boron oxide). In one embodiment, the stabilizer is a boric acid derivative. Boric acid derivatives include, but are not limited to boronic acids including isobuteneboronic acid, (2-methylpropyl)boronic acid, phenyl boronic acid, $(C_6H_5)B(OH)_2$, and any other boronic acid comprising an aromatic group, including 4-formylphenyl boronic acid, 2-hydroxy-3-methylphenyl boronic acid, (2,6-dimethoxy-4-methylphenyl)boronic acid, (2-fluoro-5-methoxycarbonylphenyl)boronic acid, (3-chloro-2-methylphen yflboronic acid, (3-ethoxy-5-fluorophenyl)boronic acid, (3-fluoro-5-ethoxycarbonylphenyl) boronic acid, (3-fluoro-5-isopropoxyphenyl)boronic acid, (3-fluoro-5-methoxycarbonylphenyl)boronic acid, (3-fluoro-5-methylphenyl)boronic acid, (3-methoxy-5-(trifluoromethyl)phenyl)boronic acid, (3-t-butyl-5-methylphenyl)boronic acid, (4-bromo-2,5-dimethylphenyl)boronic acid, (4-fluoro-3-methoxyphenyl)boronic acid, (4-methoxy-3-trifluoromethylphenyl)boronic acid, and the like. See, e.g., http://www.sigmaaldrich.com/chemistry/special-offers/boronic-acid.html?cm_sp=Insite-_-ChemSynth-_-BoronicAcidPromo for additional other boronic acid comprising an aromatic group.

The amount of boric acid derivative, compounds that contain B—OH units, or the amount of boron compound known to affect silanol condensation reactions may vary, but typically the amount selected is based on the mole ratio of the OH groups of the boric acid derivative, compounds that contain B—OH units, or the amount of boron compound known to affect silanol condensation reactions to the Si—OZ content (amount of Si—OH or Si-alkoxy) on the resin components of the resin-linear organosiloxane block copolymer compositions. Typically the mole ratio of the OH groups of boric acid derivative, compounds that contain B—OH units, or the amount of boron compound known to affect silanol condensation reactions to the Si—OZ content of the resin-linear organosiloxane block copolymers is 0.1/50, alternatively 0.5/20, or alternatively 1/10. In some embodiments, the mole ratio of the OH groups of boric acid derivative, compounds that contain B—OH units, or the amount of boron compound known to affect silanol condensation reactions to the Si—OZ content of the resin-linear organosiloxane block copolymers is 0.1/50 to 1/10, e.g., from 0.1/50 to 0.5/20, from 0.5/20 to 1/10 or from 0.5/20 to 5/20. In some embodiments, the boric acid derivative comprises phenyl boronic acid.

In some embodiments, the stabilizer comprises a silicon-containing small molecule. As used herein, the term "silicon-containing small molecule" includes, but is not limited to compounds of the formula:

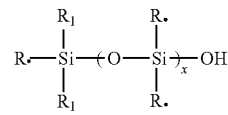

wherein each $R_1$ is the same or different and may be a $C_1$-$C_{30}$ hydrocarbyl group, as the group is defined previously. Non-limiting examples of such silicon-containing small molecules include $Ph_2MeSiOH$ and $Ph_3SiOH$.

The term "silicon-containing small molecule" also includes silanes of the formula:

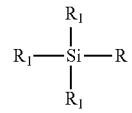

wherein each $R_1$ is the same or different and may be a $C_1$-$C_{30}$ hydrocarbyl group, as the group is defined previously; and R is $R_1$ or hydrogen. Non-limiting examples of such silanes include, but are not limited to triphenyl silane ($Ph_3SiH$) and tetraphenyl silane ($Ph_4Si$).

As used herein, the term "small molecule" refers to molecules not exceeding 1000 g/mole.

In some embodiments, the silicon-containing small molecule stabilizer is used in combination with one or more other stabilizers. For example, the silicon-containing small molecule could be used in combination with an alkaline earth metal salt, a metal chelate or a boron compound. In some embodiments, the silicon-containing small molecule is used in combination with a metal chelate (e.g., $Al(acac)_3$). In some embodiments, the silicon-containing small molecule stabilizer is added during the preparation/synthesis of the block copolymers described herein. In other embodiments, the silicon-containing small molecule stabilizer is added after the block copolymers described herein have been prepared/synthesized.

In some embodiments, the amount of the silicon-containing small molecule that me be used is less than 15 wt %, e.g., less than 10 wt %, less than 5 wt %, less than 2 wt %, less than 1 wt % or less than 0.5 wt %. In some embodiments, the amount of the silicon-containing small molecule that me be used is from about 0.1 wt % to about 10 wt %, e.g., from about 0.1 wt % to about 0.5 wt %, from about 0.25 wt % to about 1 wt %, from about 1 wt % to about 5 wt %, from about 2 wt % to about 10 wt % or from about 2 wt % to about 5 wt %.

Non-Limiting Physical Properties of the Solid Composition

The physical properties of the solid composition described herein are not limited. In some embodiments, the solid composition has a viscosity greater than 100 cSt at 120° C. or greater than 1000 cSt at 120° C., greater than 5000 cSt at 120° C. or greater than 10,000 cSt at 120° C., and, in some instances, may have an infinite viscosity. In some embodiments, the solid composition has a viscosity of from about 100 cSt to about 10,000 cSt at 120° C.; e.g., from about 1000 cSt to about 5000 cSt at 120° C.; from about 500 cSt to about 2000 cSt at 120° C.; from about 2000 cSt to about 5000 cSt or from about 5000 cSt to about 10,000 cSt at 120° C.

In some embodiments, the solid composition has a refractive index greater than 1.4 and may have a refractive index greater than 1.44, 1.5, 1.54, or alternatively greater than 1.55, as determined using ASTM D542. In some embodiments, the solid composition has a refractive index greater than 2.5. In other embodiments, the solid composition has a refractive index of from about 1.4 to about 2.5, e.g., from about 1.5 to about 2.5; from about 1.7 to about 2.4; from about 1.4 to about 1.7; or from about 1.9 to about 2.3.

In other embodiments, the solid composition has greater than 50, 55, 60, 65, 70, 75, 80, 85, 90, 95, 96, 97, 98, or 99, or about 100, % light transmittance. The light transmittance is typically determined using ASTM E-903-96 or a modified version of ASTM D1003, which specifies how to measure light transmittance using a class C light source. In the modified version, the class C light source is replaced with a light source that produces the solar spectrum (i.e., the AM 1.5G spectrum). Spectral transmittance values are also independent of reflective losses in the modified method in contrast to ASTM D1003. Measurements are acquired using a Varian Cary 5000 between 200-1700 nm.

In some embodiments, the solid composition of some of the embodiments described herein has one or more, in some cases all, of the following characteristics: resists yellowing; resists light absorption losses; has increased toughness; has excellent thermal stability; exhibits excellent flexibility in processing (e.g., B-staged films can be pre-cured, but can re-flow after curing); and/or exhibits adhesion to numerous types of surfaces, in some cases, without a need for adhesion promoters. In addition, the solid composition of some the embodiments described herein can maintain its refractive index even when its mechanical properties are manipulated and customized Moreover, PDMS resin-linears may be utilized wherein the linear and the resin block have refractive indices that are dissimilar (e.g., RI $Me_2$-D=1.41 and RI Ph-T=1.56). Furthermore, the solid composition can be tailored to have a (high) refractive index which may be matched or similar to a refractive index of a superstrate such as front glass, which increases efficiency. Moreover, the solid composition, in some embodiments, offers excellent melt flowability simultaneously with shelf stability.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

In some embodiments, the solid composition of the embodiments of the present invention retain certain physical properties such as tensile strength and % elongation at break, upon heat aging. In one embodiment, the tensile strength of the solid composition remains within 20%, alternatively within 10%, or alternatively within 5% of its original value upon heat aging at 200° C. for 1000 hours. In some embodiments, the tensile strength of the solid composition remains within from about 20% to about 1% of its original value, e.g., from about 10% to about 1%, from about 10% to about 5% or from about 5% to about 1% of its original value upon heat aging at 200° C. for 1000 hours. In some embodiments, heat aging may be conducted by heating samples within an air circulating oven at elevated temperatures and for an extended period of time (e.g., about 150-300° C. for about 50 to about 10,000 hours). In some embodiments, the tensile strength of the solid composition remains within about 1% or remains the same as its original value upon heat aging at 200° C. for 1000 hours. In other embodiments, the % elongation at break is at least 10%, alternatively 50%, or alternatively 75% upon heat aging at 200° C. for 1000 hours. In some embodiments, the % elongation at break is from about 10% to about 90%, e.g., from about 10% to about 50%, from about 25% to about 60%, from about 40% to about 60% or from about 50% to about 75% upon heat aging at 200° C. for 1000 hours.

In one embodiment, the solid compositions of the organosiloxane block copolymers may be considered as "melt processable". In this embodiment, the solid compositions, such as a coating formed from a film of a solution containing the organosiloxane block copolymers, exhibit fluid behavior at elevated temperatures, that is upon "melting". The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta as a function of temperature storage using commercially available instruments. For example, a commercial rheometer (such as TA Instruments' ARES-RDA—with 2KSTD standard flexural pivot spring transducer, with forced convection oven) may be used to measure the storage modulus (G'), loss modulus (G") and tan delta as a function of temperature. Test specimens (typically 8 mm wide, 1 mm thick) may be loaded in between parallel plates and measured using small strain oscillatory rheology while ramping the temperature in a range from 25° C. to 300° C. at 2° C./min (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). Typically, the FLOW of the solid compositions will also correlate to the glass transition temperature of the non-linear segments (i.e., the resin component) in the organosiloxane block copolymer.

In some embodiments, the tan delta=1 is from about 3 to about 5 hours at 150° C., e.g., from about 3 to about 5 minutes at 150° C., from about 10 to about 15 minutes at 150° C., from about 10 to about 12 minutes at 150° C., from about 8 to about 10 minutes at 150° C., from about 30 minutes to about 2.5 hours at 150° C., from about 1 hour to about 4 hours at 150° C. or from about 2.5 hours to about 5 hours at 150° C. In other embodiments, e.g., when a superbase is used, the tan delta=1 is from about 3 to about 60 seconds at 150° C., e.g., from about 3 to about 30 seconds at 150° C., from about 10 to about 45 seconds at 150° C., from about 5 to about 50 seconds at 150° C., from about 15 to about 30 seconds at 150° C. or from about 30 seconds to about 60 seconds at 150° C. In still other embodiments, e.g., when a superbase is used, the tan delta=1 is from about 5 to about 1200 seconds at 120° C., e.g., from about 20 to about 60 seconds at 120° C., from about 20 to about 600 seconds at 120° C., from about 60 to about 1200 seconds at 120° C., from about 5 to about 100 seconds at 120° C., from about 10 to about 60 seconds at 120° C. or from about 30 seconds to about 60 seconds at 120° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one example, the solid compositions of the organosiloxane block copolymers may be considered as "curable". In this example, the solid compositions, such as a coating formed from a film of a solution containing the organosiloxane block copolymers, may undergo further physical property changes by further curing the block copolymer. As discussed above, the present organosiloxane block copolymers contain a certain amount of silanol groups. It is possible that the presence of these silanol groups on the block copolymer permit further reactivity, i.e., a cure mechanism. Upon curing, the physical properties of solid compositions may be further altered, as discussed in certain embodiments below.

Alternatively, the "melt processability" and/or cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

The structural ordering of the disiloxy and trisiloxy units in the organosiloxane block copolymer as described above may provide the organosiloxane block copolymer with certain unique physical property characteristics when the solid composition arc formed. For example, the structural ordering of the disiloxy and trisiloxy units in the copolymer may provide solid composition that allow for a high optical transmittance of visible light. The structural ordering may also allow the organosiloxane block copolymer to flow and cure upon heating, yet remain stable at room temperature. The siloxy units may also he processed using lamination techniques. These properties may be useful to provide coatings for various electronic articles to improve weather resistance and durability, while providing low cost and easy procedures that are energy efficient.

Curable Silicone Composition

This disclosure also provides a curable silicone composition. The curable silicone composition includes the organosiloxane block copolymer described above. In some embodiments, the curable silicone composition also includes an organic solvent. In some embodiments, the term "curable silicone composition" also includes a combination of the solid composition in, or combined with, a solvent. The organic solvent, in some embodiments, is an aromatic solvent, such as benzene, toluene, or xylene.

The curable compositions described herein may further contain an organosiloxane resin (e.g., free resin that is not part of the block copolymer). The organosiloxane resin present in these compositions typically will be the organosiloxane resin used to prepare the organosiloxane block copolymer. Thus, the organosiloxane resin may comprise at least 60 mole % of [$R^2SiO_{3/2}$] siloxy units in its formula (e.g., at least 70 mole % of [$R^2SiO_{3/2}$] siloxy units, at least 80 mole % of [$R^2SiO_{3/2}$] siloxy units, at least 90 mole % of [$R^2SiO_{3/2}$] siloxy units, or 100 mole % of [$R^2SiO_{3/2}$] siloxy units; or 60-100 mole % [$R^2SiO_{3/2}$] siloxy units, 60-90 mole % [$R^2SiO_{3/2}$] siloxy units or 70-80 mole % [$R^2SiO_{3/2}$] siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

When the curable composition includes organosiloxane block copolymer, organic solvent, and optional organosiloxane resin, the amounts of each component may vary. The amount of the organosiloxane block copolymers, organic solvent, and optional organosiloxane resin in the present curable composition may vary. The curable composition of the present disclosure may contain:

40 to 80 weight % of the organosiloxane block copolymer as described above (e.g., 40 to 70 weight %, 40 to 60 weight %, 40 to 50 weight %); 10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight; and
   5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %).

Such that the sum of the weight % of these components does not exceed 100%. In one example, the curable compositions consist essentially of the organosiloxane block copolymer as described above, the organic solvent, and the organosiloxane resin. In this example, the weight % of these components sum to 100%, or nearly 100%. The terminology "consisting essentially of" relative to the immediately aforementioned example, describes that, in this example, the curable silicone composition is free of silicone or organic polymers that are not the organosiloxane block copolymer or organosiloxane resin of this disclosure.

The curable silicone composition may also include a cure catalyst. The cure catalyst may be chosen from any catalyst known in the art to affect (condensation) cure of organosiloxanes, such as various tin or titanium catalysts. Condensation catalysts can be any condensation catalyst typically used to promote condensation of silicon bonded hydroxy (=silanol) groups to form Si—O—Si linkages. Examples include, but are not limited to, amines, complexes of lead, tin, titanium, zinc, and iron.

In one example, a linear soft block siloxane unit, e.g., with dp>2 (e.g., dp>10; dp>50; dp>100; dp>150; or dp from about 2 to about 150; dp from about 50 to about 150; or dp from about 70 to about 150) is grafted to a linear or resinous "hard block" siloxane unit with a glass transition above room temperature. In a related example, the organosiloxane block copolymer (e.g., silanol terminated organosiloxane block copolymer) is reacted with a silane, such as methyl triacctoxy silane and/or methyl trioxime silane, followed by reaction with a silanol functional phenyl silsesquioxane resin. In still other embodiments, the organosiloxane block copolymer includes one or more soft blocks (e.g., blocks with glass transition<25° C.) and one or more linear siloxane "pre-polymer" blocks that, in some embodiments, include aryl groups as side chains (e.g., poly(phenyl methyl siloxane). In another example, the organosiloxane block copolymer includes PhMc-D contents>20 mole % (e.g., >30 mole %; >40 mole %; >50 mole %; or from about 20 to about 50 mole %; about 30 to about 50 mole %; or from about 20 to about 30 mole %); PhMe-D dp>2 (e.g., dp>10; dp>50; dp>100; dp>150; or dp from about 2 to about 150; dp from about 50 to about 150; or dp from about 70 to about 150); and/or Ph$_2$-D/Me$_2$-D>20 mole % (e.g., >30 mole %; >40 mole %; >50 mole %; or from about 20 to about 50 mole %; about 30 to about 50 mole %; or from about 20 to about 30 mole %), where the mole ratio of Ph$_2$-D/Me$_2$-D is about 3/7. In some embodiments, the Ph$_2$-D/Me$_2$-D mole ratio is from about 1/4 to about 1/2, e.g., about 3/7 to about 3/8. In still other embodiments, the organosiloxane block copolymer includes one or more hard blocks (e.g., blocks with glass transition>25° C.) and one or more linear or resinous siloxanes, for example, phenyl silsesquioxane resins, which may be used to form non-tacky films.

Method of Forming the Solid Composition

The solid composition of this invention may be formed by a method that includes the step of reacting one or more resins, such as Phenyl-T resins, with one or more (silanol) terminated siloxanes, such as PhMe siloxanes. Alternatively, one or more resins may be reacted with one or more capped siloxane resins, such as silanol terminated siloxanes capped with MTA/ETA, MTO, ETS 900, and the like. In another example, the solid composition is formed by reacting one or more components described above and/or one or more components described in U.S. Prov. Patent Appl. Ser. Nos. 61/385,446, filed Sep. 22, 2010; 61/537,146, filed Sep. 21, 2011; 61/537,151, filed Sep. 21, 2011; and 61/537,756, filed Sep. 22, 2011; and/or described in Published PCT Appl. Nos. WO2012/040302; WO2012/040305; WO2012/040367; WO2012/040453; and WO2012/040457, all of which are expressly incorporated herein by reference. In still another example, the method may include one or more steps described any of the aforementioned applications.

Alternatively, the method may include the step of providing the composition in a solvent, e.g., a curable silicone composition that includes a solvent, and then removing the solvent to form the solid composition. The solvent may be removed by any known processing techniques. In one example, a film including the organosiloxane block copolymer is formed and the solvent is allowed to evaporate from a curable silicone composition thereby forming a film. Subjecting the films to elevated temperatures, and/or reduced pressures, will accelerate solvent removal and subsequent formation of the solid composition. Alternatively, a curable silicone composition may be passed through an extruder to remove solvent and provide a solid composition in the form of a ribbon or pellets. Coating operations against a release film can also be used as in slot die coating, knife over roll coating, rod coating, or gravure coating. Also, roll-to-roll coating operations can be used to prepare a solid film. In coating operations, a conveyer oven or other means of heating and evacuating the solution can be used to drive off the solvent and obtain a solid composition.

Method of Forming the Organosiloxane Block Copolymer

The organosiloxane block copolymer may be formed using a method that includes the step of I) reacting a) a linear organosiloxane and b) an organosiloxane resin comprising at least 60 mol % of [R$^2$SiO$_{3/2}$] siloxy units in its formula, in c) a solvent. In one example, the linear organosiloxane has the formula R$^1_q$(E)$_{(3-q)}$SiO(R$^1_2$SiO$_{2/2}$)$_n$Si(E)$_{(3-q)}$R$^1_q$, wherein each R$^1$ is independently a C$_1$ to C$_{30}$ hydrocarbyl, n is 10 to 400, q is 0, 1, or 2, E is a hydrolyzable group including at least one carbon atom. In another example, each R$^2$ is independently a C$_1$ to C$_{20}$ hydrocarbyl. In still another example, the amounts of a) and b) used in step I are selected to provide the organosiloxane block copolymer with 40 to 90 mole % of disiloxy units [R$^1_2$SiO$_{2/2}$] and 10 to 60 mole % of trisiloxy units [R$^2$SiO$_{3/2}$]. In an even further example, at least 95 weight percent of the linear organosiloxane added in step I is incorporated into the organosiloxane block copolymer.

In still another example, the method includes step of II) reacting the organosiloxane block copolymer from step I), e.g., to crosslink the trisiloxy units of the organosiloxane block copolymer and/or to increase the weight average molecular weight ($M_w$) of the organosiloxane block copolymer by at least 50%. A further example includes the step of further processing the organosiloxane block copolymer to enhance storage stability and/or optical clarity and/or the optional step of removing the organic solvent.

Figure 12:
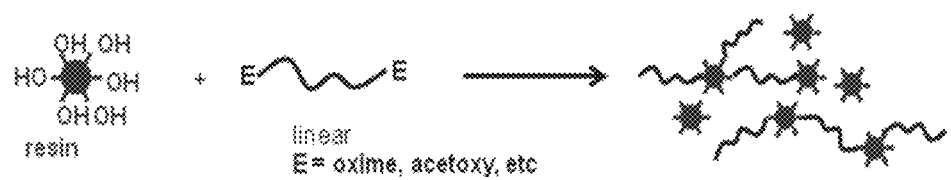

The reaction of the first step may be represented generally according to the schematic shown in FIG. 12. wherein various OH groups (i.e., SiOH groups) on the organosiloxane resin may be reacted with the hydrolyzable groups I on the linear organosiloxane, to form the organosiloxane block copolymer and an H-I compound. The reaction in step I may be described as a condensation reaction between the organosiloxane resin and the linear organosiloxane.

The (a) Linear Organosiloxane

Component a) in step I of the present process is a linear organosiloxane having the formula $R^1_q(E)_{(3-q)}SiO(R^1_2SiO_{2/2})_nSi(E)_{(3-q)}R^1_q$, where each $R^1$ is independently a $C_1$ to $C_{30}$ hydrocarbyl, the subscript "n" may be considered as the degree of polymerization (dp) of the linear organosiloxane and may vary from 10 to 400, the subscript "q" may be 0, 1, or 2, and E is a hydrolyzable group containing at least one carbon atom. While component a) is described as a linear organosiloxane having the formula $R^1_q(E)_{(3-q)}SiO(R^1_2SiO_{2/2})_nSi(E)_{(3-q)}R^1_q$, one skilled in the art recognizes small amount of alternative siloxy units, such a T ($R^1SiO_{3/2}$) siloxy units, may be incorporated into the linear organosiloxane and still be used as component a). As such, the organosiloxane may be considered as being "predominately" linear by having a majority of D ($R^1_2SiO_{2/2}$) siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

$R^1$ in the above linear organosiloxane formula is independently a $C_1$ to $C_{30}$ hydrocarbyl. The hydrocarbon group may independently be an alkyl, aryl, or alkylaryl group. As used herein, hydrocarbyl also includes halogen substituted hydrocarbyls, where the halogen may be chlorine, fluorine, bromine or combinations thereof. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

E may be selected from any hydrolyzable group containing at least one carbon atom. In some embodiments, E is selected from an oximo, epoxy, carboxy, amino, amido group or combinations thereof. Alternatively, E may have the formula $R^1C(=O)O-$, $R^1_2C=N-O-$, or $R^4C=N-O-$, where $R^1$ is as defined above, and $R^4$ is hydrocarbyl. In one example, E is $H_3CC(=O)O-$ (acetoxy) and q is 1. In one example, E is $(CH_3)(CH_3CH_2)C=N-O-$ (methylethylketoxy) and q is 1.

In one example, the linear organosiloxane has the formula $(CH_3)_q(E)_{(3-q)}SiO[(CH_3)_2SiO_{2/2}]_nSi(E)_{(3-q)}(CH_3)_q$, where E, n, and q are as defined above.

In one example, the linear organosiloxane has the formula $(CH_3)_q(E)_{(3-q)}SiO[(CH_3)(C_6H_5)SiO_{2/2}]_nSi(E)_{(3-q)}(CH_3)_q$, where E, n, and q are as defined above.

Processes for preparing linear organosiloxanes suitable as component a) are known. In some embodiments, a silanol terminated polydiorganosiloxane is reacted with an "endblocking" compound such as an alkyltriacetoxysilane or a dialkylketoxime. The stoichiometry of the endblocking reaction is typically adjusted such that a sufficient amount of the endblocking compound is added to react with all the silanol groups on the polydiorganosiloxane. Typically, a mole of the endblocking compound is used per mole of silanol on the polydiorganosiloxane. Alternatively, a slight molar excess such as 1 to 10% of the endblocking compound may be used. The reaction is typically conducted under anhydrous conditions to minimize condensation reactions of the silanol polydiorganosiloxane. Typically, the silanol ended polydiorganosiloxane and the endblocking compound are dissolved in an organic solvent under anhydrous conditions, and allowed to react at room temperature, or at elevated temperatures (e.g., up to the boiling point of the solvent).

The (b) Organosiloxane Resin

Component b) in the present process is an organosiloxane resin comprising at least 60 mole % of [$R^2SiO_{3/2}$] siloxy units in its formula, where each $R^2$ is independently a $C_1$ to $C_{20}$ hydrocarbyl. As used herein, hydrocarbyl also includes halogen substituted hydrocarbyls, where the halogen may be chlorine, fluorine, bromine or combinations thereof. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The organosiloxane resin may contain any amount and combination of other M, D, and Q siloxy units, provided the organosiloxane resin contains at least 70 mole % of [$R^2SiO_{3/2}$] siloxy units, alternatively the organosiloxane resin contains at least 80 mole % of [$R^2SiO_{3/2}$] siloxy units, alternatively the organosiloxane resin contains at least 90 mole % of [$R^2SiO_{3/2}$] siloxy units, or alternatively the organosiloxane resin contains at least 95 mole % of [$R^2SiO_{3/2}$] siloxy units. In some embodiments, the organosiloxane resin contains from about 70 to about 100 mole % of [$R^2SiO_{3/2}$] siloxy units, e.g., from about 70 to about 95 mole % of [$R^2SiO_{3/2}$] siloxy units, from about 80 to about 95 mole % of [$R^2SiO_{3/2}$] siloxy units or from about 90 to about 95 mole % of [$R^2SiO_{3/2}$] siloxy units. Organosiloxane resins useful as component b) include those known as "silsesquioxane" resins.

The weight average molecular weight ($M_w$) of the organosiloxane resin is not limiting, but, in some embodiments, ranges from 1000 to 10,000, or alternatively 1500 to 5000 g/mole.

One skilled in the art recognizes that organosiloxane resins containing such high amounts of [$R^2SiO_{3/2}$] siloxy units may have a certain concentration of Si—OZ where Z may be hydrogen (i.e., silanol), an alkyl group (so that OZ is an alkoxy group), or alternatively OZ may also be any of the "E" hydrolyzable groups as described above. The Si—OZ content as a mole percentage of all siloxy groups present on the organosiloxane resin may be readily determined by $^{29}$Si NMR. The concentration of the OZ groups present on the organosiloxane resin will vary, as dependent on the mode of preparation, and subsequent treatment of the resin. In some embodiments, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

Organosiloxane resins containing at least 60 mole % of $[R^2SiO_{3/2}]$ siloxy units, and methods for preparing them, are known in the art. They are typically prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

One skilled in the art further recognizes that organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the organosiloxane resin prior to reacting in step T. This may be achieved by dissolving the organosiloxane resin in an organic solvent, heating to reflux, and removing water by separation techniques (for example Dean Stark trap or equivalent process).

The amounts of a) and b) used in the reaction of step I are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$. The mole % of dilsiloxy and trisiloxy units present in components a) and b) may be readily determined using $^{29}$Si NMR techniques. The starting mole % then determines the mass amounts of components a) and b) used in step I.

In some embodiments, the organosiloxane block copolymers comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

The amount of components a) and b) selected should also ensure there is a molar excess of the silanol groups on the organosiloxane resin vs. amount of linear organosiloxane added. Thus, a sufficient amount of the organosiloxane resin should be added to potentially react with all the linear organosiloxane added in step I). As such, a molar excess of the organosiloxane resin is used. The amounts used may be determined by accounting for the moles of the organosiloxane resin used per mole of the linear organosiloxane.

As discussed above, the reaction affected in step I is a condensation reaction between the hydrolyzable groups of linear organosiloxane with the silanol groups on the organosiloxane resin. A sufficient amount of silanol groups needs to remain on the resin component of the formed resin-linear organosiloxane copolymer to further react in step II of the present process. In some embodiments, at least 10 mole %, alternatively at least 20 mole %, or alternatively at least 30 mole % silanol should remain on the trisiloxy units of the resin-linear organosiloxane copolymer as produced in step I of the present process. In some embodiments, from about 10 mole % to about 60 mole %, e.g., from about 20 mole % to about 60 mole %, or from about 30 mole % to about 60 mole %, should remain on the trisiloxy units of the resin-linear organosiloxane copolymer as produced in step I of the present process.

The reaction conditions for reacting the aforementioned (a) linear organosiloxane with the (b) organosiloxane resin are not limited. In some embodiments, reaction conditions are selected to effect a condensation type reaction between the a) linear organosiloxane and b) organosiloxane resin. Various non-limiting embodiments and reaction conditions are described in the Examples below. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. Typically, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar. Typically, aromatic solvents such as toluene, xylene, benzene, and the like are utilized. The amount of the organosiloxane resin dissolved in the organic solvent may vary, but typically the amount should be selected to minimize the chain extension of the linear organosiloxane or pre-mature condensation of the organosiloxane resin.

The order of addition of components a) and b) may vary. In some embodiments, the linear organosiloxane is added to a solution of the organosiloxane resin dissolved in the organic solvent. This order of addition may enhance the condensation of the hydrolyzable groups on the linear organosiloxane with the silanol groups on organosiloxane resin, while minimizing chain extension of the linear organosiloxane or premature condensation of the organosiloxane resin. In other embodiments, the organosiloxane resin is added to a solution of the linear organosiloxane dissolved in the organic solvent.

The progress of the reaction in step I, and the formation of the resin-linear organosiloxane block copolymer, may be monitored by various analytical techniques, such as GPC, IR, or $^{29}$Si NMR. Typically, the reaction in step I is allowed to continue until at least 95 weight percent (e.g., at least 96%, at least 97%, at least 98%, at least 99% or 100%) of the linear organosiloxane added in step I is incorporated into the resin-linear organosiloxane block copolymer.

The second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%. In some embodiments, the second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer from about 50% to about 100%, e.g., from about 60% to about 100%, from about 70% to about 100%, from about 80% to about 100% or from about 90% to about 100%.

Figure 13:
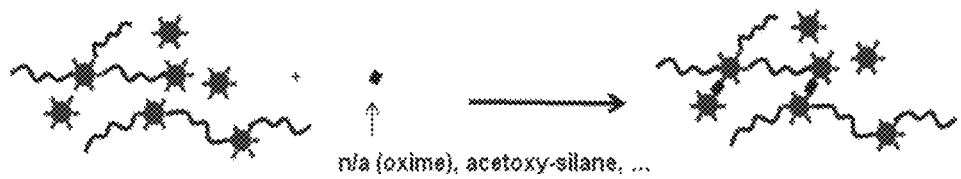

The reaction of the second step of the method may be represented generally according to the schematic shown in FIG 13.

It is believed that reaction of step II crosslinks the trisiloxy blocks of the resin-linear organosiloxane block copolymer formed in step I, which will increase the average molecular weight of the block copolymer. It is also possible that the crosslinking of the trisiloxy blocks provides the block copolymer with an aggregated concentration of trisiloxy blocks, which ultimately may help to form "nano-domains" in solid compositions of the block copolymer. In other words, this aggregated concentration of trisiloxy blocks may phase separate when the block copolymer is isolated in a solid form such as a film or cured coating. The aggregated concentration of trisiloxy block within the block copolymer and subsequent formation of "nano-domains" in the solid compositions containing the block copolymer, may provide for enhanced optical clarity of these compositions as well as the other physical property benefits associated with these materials.

The crosslinking reaction in Step II may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin in step I of the preparation of the block copolymer. The free resin component may crosslink with the non-linear blocks by condensation of the residual silanol groups present on the non-linear blocks and on the free resin. The free resin may provide crosslinking by reacting with lower molecular weight compounds added as crosslinkers, as described below.

Step II of the present process may occur simultaneous upon formation of the resin-linear organosiloxane of step I, or involve a separate reaction in which conditions have been modified to affect the step II reaction. The step II reaction may occur in the same conditions as step I. In this situation, the step II reaction proceeds as the resin-linear organosiloxane copolymer is formed. Alternatively, the reaction conditions used for step I) are extended to further the step II reaction. Alternatively, the reaction conditions may be changed, or additional ingredients added to affect the step II reaction.

In some embodiments, the step II reaction conditions may depend on the selection of the hydrolyzable group (E) used in the starting linear organosiloxane. When (E) in the linear organosiloxane is an oxime group, it is possible for the step II reaction to occur under the same reaction conditions as step I. That is, as the linear-resin organosiloxane copolymer is formed in step I, it will continue to react via condensation of the silanol groups present on the resin component to further increase the molecular weight of the resin-linear organosiloxane copolymer. Not wishing to be bound by any theory, it is possible that when (E) is an oximo group, the hydrolyzed oximo group (for example methyl ethylketoxime) resulting from the reaction in step I may act as a condensation catalyst for the step II reaction. As such, the step II reaction may proceed simultaneously under the same conditions for step I. In other words, as the resin-linear organosiloxane copolymer is formed in step I, it may further react under the same reaction conditions to further increase its molecular weight via a condensation reaction of the silanol groups present on the resin component of the copolymer. However, when (E) on the linear organosiloxane is an acetoxy group, the resulting hydrolyzed group (acetic acid), does not sufficiently catalyze the step II) reaction. Thus, in this situation the step II reaction may be enhanced with a further component to affect condensation of the resin components of the resin-linear organosiloxane copolymer, as described in the example below.

In one example of the present process, an organosilane having the formula $R^5{}_q SiX_{4-q}$ is added during step II), where $R^5$ is a $C_1$ to $C_8$ hydrocarbyl or a $C_1$ to $C_8$ halogen-substituted hydrocarbyl, X is a hydrolyzable group, and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be E, as defined above, a halogen atom, hydroxyl (OH), or an alkoxy group. In one example, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in this example include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketoxime)silane.

The amount of organosilane having the formula $R^5_qSiX_{4-q}$ when added during step II) varies, but should be based on the amount of organosiloxane resin used in the process. The amount of silane used should provide a molar stoichiometry of 2 to 15 mole % of organosilane per moles of Si on the organosiloxane resin. Furthermore, the amount of the organosilane having the formula $R^5_qSiX_{4-q}$ added during step II) is controlled to ensure a stoichiometry that does not consume all the silanol groups on the organosiloxane block copolymer. In one example, the amount of the organosilane added in step II is selected to provide an organosiloxane block copolymer containing 0.5 to 35 mole percent of silanol groups [≡SiOH].

Step III in the present method is optional, and includes further processing the organosiloxane block copolymer formed using the aforementioned method steps to enhance storage stability and/or optical clarity. As used herein the phrase "further processing" describes any further reaction or treatment of the organosiloxane block copolymer to enhance storage stability and/or optical clarity. The organosiloxane block copolymer as produced in step II may include an amount of reactive "OZ" groups (e.g., ≡SiOZ groups, where Z is as described above), and/or X groups (where X is introduced into the organosiloxane block copolymer when the organosilane having the formula $R^5_qSiX_{4-q}$ is used in step II). The OZ groups present on the organosiloxane block copolymer at this stage may be silanol groups that were originally present on the resin component, or alternatively may result from the reaction of the organosilane having the formula $R^5_qSiX_{4-q}$ with silanol groups, when the organosilane is used in step II. Alternatively, further reaction of residual silanol groups may further enhance the formation of the resin domains and improve the optical clarity of the organosiloxane block copolymer. Thus, optional step III may be performed to further react OZ or X present on the organosiloxane block copolymer produced in Step II to improve storage stability and/or optical clarity. The conditions for step III may vary, depending on the selection of the linear and resin components, their amounts, and the endcapping compounds used.

In one example of the method, step III is performed by reacting the organosiloxane block copolymer from step II with water and removing any small molecular compounds formed in the method such as acetic acid. In this example, the organosiloxane block copolymer is typically produced from a linear organosiloxane where E is an acetoxy group, and/or an acetoxy silane is used in step II. Although not wishing to be bound by any theory, the organosiloxane block copolymer formed in step II may include a quantity of hydrolyzable Si—O—C(O)CH₃ groups, which may limit the storage stability of the organosiloxane block copolymer. Thus, water may be added to the organosiloxane block copolymer formed from step II, which may hydrolyze Si—O—C(O)CH₃ groups to further link the trisiloxy units, and eliminate acetic acid. The formed acetic acid, and any excess water, may be removed by known separation techniques. The amount of water added in this example may vary, but typically is 10 weight %, or alternatively 5 weight % is added per total solids (as based on organosiloxane block copolymer in the reaction medium).

In another example of the method, step III is performed by reacting the organosiloxane block copolymer from step II with an endcapping compound chosen from an alcohol, oxime, or trialkylsiloxy compound. In this embodiment, the organosiloxane block copolymer is typically produced from a linear organosiloxane where E is an oxime group. The endcapping compound may be a $C_1$-$C_{20}$ alcohol such as methanol, ethanol, propanol, butanol, or others in the series. Alternatively, the alcohol is n-butanol. The endcapping compound may also be a trialkylsiloxy compound, such as trimethylmethoxysilane or trimethylethoxysilane. The amount of endcapping compound may vary but typically is between 3 and 15 wt % with respect to the organosiloxane block copolymer.

In some embodiments, step III includes adding to the resin-linear organosiloxane block copolymer from step II) a superbase catalyst or a stabilizer. The superbase catalyst and stabilizer amounts used in step III are the same as described above.

Step IV of the present process is optional, and involves removing the organic solvent used in the reactions of steps I and II. The organic solvent may be removed by any known techniques, but typically involves heating the resin-linear organosiloxane copolymer compositions at elevated temperature, either at atmospheric conditions or under reduced pressures. In some embodiments, not all of the solvent is removed. In this example, at least 20%, at least 30%, at least 40%, or at least 50% of the solvent is removed, e.g., at least 60%, at least 70%, at least 75%, at least 80% or at least 90% of the solvent is removed. In some embodiments, less than 20% of the solvent is removed, e.g., less than 15%, less than 10%, less than 5% or 0% of the solvent is removed. In other embodiments, from about 20% to about 100% of the solvent is removed, e.g., from about 30% to about 90%, from about 20% to about 80%, from about 30 to about 60%, from about 50 to about 60%, from about 70 to about 80% or from about 50% to about 90% of the solvent is removed.

In additional non-limiting embodiments, this disclosure includes one or more elements, components, method steps, test methods, etc., as described in one or more of Published PCT Appl. Nos. WO2012/040302; WO2012/040305; WO2012/040367; WO2012/040453; and WO2012/040457, all of which are expressly incorporated herein by reference.

Method of Forming a Curable Silicone Composition

A curable silicone composition may be formed using a method that includes the step of combining the solid composition and a solvent, as described above. The method may also include one or more steps of introducing and/or combining additional components, such as the organosiloxane resin and/or cure catalyst to one or both of the solid composition and the solvent. A solid composition and the solvent may be combined with each other and/or any other components using any method known in the art such as stirring, vortexing, mixing, etc.

Method of Forming the Optical Assembly

This disclosure also provides a method of forming the optical assembly. The method includes the step of combining the light emitting diode and the layer to form the optical assembly. The step of combining is not particularly limited and may be include, or be further defined as, disposing the light emitting diode and the layer next to each other or on top of each other, and/or in direct or in indirect contact with each other. For example, the layer may be disposed on and in direct contact with the light emitting diode. Alternatively, the layer may be disposed on, but separated from and not in direct contact with, the light emitting diode yet may still be disposed on the light emitting diode.

The layer may be heated to flow, melted, pressed, (vacuum) laminated, compression molded, injection transfer molded, calendared, hot-embossed, injection molded, extruded, or any other process step that changes the layer from a solid to a liquid or to a softened solid.

The liquid or softened layer may then be applied to the light emitting diode by any one or more of the aforementioned techniques, via spraying, pouring, painting, coating, dipping, brushing, or the like.

In one example, the step of combining is further defined as melting the layer such that the solid composition is disposed on and in direct contact with the light emitting diode. In another example, the step of combining is further defined as melting the layer such that the layer is disposed on and in indirect contact with the light emitting diode. In still another example, the method further includes the step of providing a solution of the solid composition in a solvent, e.g., dissolved or partially dissolved in the solvent. In an even further example, the method includes the step of removing the solvent to form the solid composition to form the layer prior to the step of combining the light emitting diode and the layer. In still another example, the method further includes the step of forming the solid composition into the layer subsequent to the step of removing the solvent and prior to the step of combining the light emitting diode and the layer.

In other embodiments, the method includes the step of curing the solid composition, e.g., via a condensation reaction, a free radical reaction, or a hydrosilylation reaction. It is contemplated that any catalysts, additives, and the like may be utilized in the step of curing. For example, acidic or basic condensation catalysts may be utilized. Alternatively, hydrosilylation catalysts, such as platinum catalysts, may be utilized. In one example, the step of curing occurs at a temperature higher than the melting temperature of the solid composition. Alternatively, the step of curing may occur at approximately the melting temperature, or below the melting temperature, of the layer.

EXAMPLES

A series of examples including solid compositions and organosiloxane block copolymers are formed according to this disclosure. A series of comparative examples are also formed but not according to this disclosure. After formation, the examples and the comparative examples are formed into sheets which are then further evaluated.

Characterization Techniques $^{29}$Si and $^{13}$C NMR Spectrometry

NMR samples of resin linear compositions were prepared by weighing ~3 grams of solvent free resin linear (prepared by drying sample overnight at room temperature), 1 g of CDCl$_3$, and 4 grams of 0.04 M Cr(acac)$_3$ solution in CDCl$_3$ into a vial and mixing thoroughly Samples were then transferred into a silicon-free NMR tube. Spectra were acquired using a Varian Mercury 400 MHz NMR. NMR samples of other materials such as 217 Flake and silanol terminated PDMS were prepared by diluting 4 g of sample into 4 grams of 0.04 M Cr(acac)$_3$ solution in CDCl$_3$.

$^{13}$C NMR experiments were performed in the following manner. Samples were placed into 16 mm glass NMR tubes. A 5 mm NMR tube was placed inside the 16 mm tube and filled with lock solvent. $^{13}$C DEPT NMR was acquired in 12 or 20 minute signal averaging blocks. Data was acquired on a Varian Inova NMR spectrometer with a $^1$H operational frequency of 400 MHz.

Silanol content of resin linear products was calculated from the integration values of the T(Ph,OZ) and T(Ph,OZ2) regions in the $^{29}$Si NMR spectrum. T(Alkyl) groups were considered fully condensed (assumption) and subtracted from the T(Ph,OZ) region. The T(Alkyl) content was calculated by multiplying the integration value of D(Me$_2$) from $^{29}$Si NMR by the fraction (moles Si of coupling agent/moles Si of PDMS used in the synthesis formulation). Isopropoxy from 217 Flake was not subtracted out of the OZ values due to its low concentration. Therefore it was assumed that total OZ=total OH.

GPC Analysis

Samples were prepared in certified THF at 0.5% w/v concentration, filtered with a 0.45 µm PTFE syringe filter, and analyzed against polystyrene standards. The relative calibration (3$^{rd}$ order fit) used for molecular weight determination was based on 16 polystyrene standards ranging in molecular weights from 580 to 2,320,000 Daltons. The chromatographic equipment consisted of a Waters 2695 Separations Module equipped with a vacuum degasser, a Waters 2410 differential refractometer and two (300 mm×7.5 mm) Polymer Laboratories Mixed C columns (molecular weight separation range of 200 to 3,000,000) preceded by a guard column. The separation was performed using certified grade THF programmed to flow at 1.0 mL/min., injection volume was set at 100 µL and columns and detector were heated to 35υX. Data collection was 25 minutes and processing was performed using Atlas/Cirrus software.

To determine free resin content, the free resin peak at lower molecular weight was integrated to get the area percent.

Rheology Analysis

A commercially available rheometer from TA Instruments (ARES-RDA with 2KSTD standard flexural pivot spring transducer, TA Instruments, New Castle, Del. 19720) with forced convection oven was used to measure the storage modulus (G'), loss modulus (G") and tan delta as a function of temperature. Test specimens (typically 8 mm wide, 1 mm thick) were loaded in between parallel plates and measured using small strain oscillatory rheology while ramping the temperature in a range from 25° C. to 300° C. at 2° C./min (frequency 1 Hz).

To characterize the copolymers, the flow onset was calculated as the inflection temperature in the G' drop (labeled FLOW), the viscosity at 120° C. will be reported as a measure for melt processability and the cure onset was calculated as the inflection temperature in the G' rise (labeled CURE).

Tear Strength

Tear strengths were evaluated according to ASTM D624. Specimens were die cut from cured films typically measuring 1-2 mm in thickness. If testing Type B or Type C geometries three specimens were utilized. If testing type T (trouser), one to three specimens were prepared depending on the amount of sample film available. Before testing no special storage considerations were taken as the materials were not expected to be significantly affected by small changes in temperature or humidity. Specimens were tested at ambient temperature and humidity with an Instron universal test machine utilizing Bluehill 2 software. For type B and C specimens the test speed used was 500 mm/min and specimens were pulled to failure. Median peak force/thickness was reported. For type T (trouser) specimens a pulling speed of 50 mm/min was used and specimens were pulled until the tear force was seen to level off or until failure occurred. After testing the beginning and ending points of the level region of the force curve were identified visually. Then the analyzing function of the software was used to calculate the average tear force/thickness within the identified region. If more than one specimen was tested the median reading was reported.

Optical Clarity

Optical clarity was evaluated as the % transmission of light at wavelengths from about 350-1000 nanometers, measured through 1 mm thick samples of cast sheets of the present compositions. Samples having a % transmittance of at least 95% were considered to be optically clear.

Example 1

A 500 mL 4 neck round bottom flask is loaded with toluene (65.0 g) and Phenyl-T Resin (FW=136.6 g/mole Si; 35.0 g, 0.256 moles Si). The flask is equipped with a thermometer, Teflon stir paddle, and a Dean Stark apparatus prefilled with toluene and attached to a water-cooled condenser. A nitrogen blanket is then applied. An oil bath is used to heat the flask at reflux for 30 minutes. Subsequently, the flask is cooled to about 108° C. (pot temperature).

A solution of toluene (35.0 g) and silanol terminated PhMe siloxane (140 dp, FW=136.3 g/mole Si, 1.24 mole % SiOH, 65.0 g, 0.477 moles Si) is then prepared and the siloxane is capped with 50/50 MTA/ETA (Avg. FW=231.2 g/mole Si, 1.44 g, 0.00623 moles) in a glove box (same day) under nitrogen by adding 50/50 MTA/ETA to the siloxane and mixing at room temperature for 2 hours. The capped siloxane is then added to the Phenyl-T Resin/toluene solution at 108° C. and refluxed for about 2 hours.

After reflux, the solution is cooled back to about 108° C. and an additional amount of 50/50 MTA/ETA (Avg. FW=231.2 g/mole Si, 6.21 g, 0.0269 moles) is added and the solution is then refluxed for an additional hour.

Subsequently, the solution is cooled to 90° C. and then 12 mL of DI water is added. The solution including the water is then heated to reflux for about 1.5 hours to remove the water via azeotropic distillation. The addition of water and subsequent reflux is then repeated. A total amount of aqueous phase removed is about 27.3 g.

Subsequently, some toluene (about 54.0 g) along with most residual acetic acid is then distilled off (for about 20 minutes) to increase the solids content.

The solution is then cooled to room temperature and the solution is pressure filtered through a 5.0 µm filter to isolate the solid composition.

The solid composition is analyzed by $^{29}$Si NMR which confirms a structure of $D^{PhMe}_{0.635}T^{Alkyl}_{0.044}T^{Cyclohexyl}_{0.004}T^{Ph}_{0.317}$ with an OZ of about 11.8 mole %.

Example 2

A 2 L 3 neck round bottom flask is loaded with toluene (544.0 g) and 216.0 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (176.0 g) and 264.0 g of the silanol terminated PhMe siloxane described above is prepared and the siloxane is capped with 50/50 MTA/ETA (4.84 g, 0.0209 moles Si) in a glove box (same day) under nitrogen by adding the MTA/ETA to the siloxane and mixing at room temperature for 2 hours, as also described above.

The capped siloxane is then added to the Phenyl-T Resin/toluene solution at 108° C. and refluxed for about 2 hours.

After reflux, the solution is cooled back to about 108° C. and an additional amount of 50/50 MTA/ETA (38.32 g, 0.166 moles Si) is added and the solution is then refluxed for an additional 2 hours.

Subsequently, the solution is cooled to 90° C. and then 33.63 g of DT water is added.

The solution including the water is then heated to reflux for about 2 hours to remove the water via azeotropic distillation. The solution is then heated at reflux for 3 hours. Subsequently, the solution is cooled to 100° C. and then pre-dried Darco G60 carbon black (4.80 g) is added thereto.

The solution is then cooled to room temperature with stirring and then stirred overnight at room temperature. The solution is then pressure filtered through a 0.45 µm filter to isolate the solid composition.

The solid composition is analyzed by $^{29}$Si NMR which confirms a structure of $D^{PhMe}_{0.519}T^{Alkyl}_{0.050}T^{Ph}_{0.431}$ with an OZ of about 22.2 mole %. No acetic acid is detected in the solid composition using FT-IR analysis.

Example 3

A 500 mL 3 neck round bottom flask is loaded with toluene (86.4 g) and 33.0 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (25.0 g) and 27.0 g of the silanol terminated PhMe siloxane described above is prepared and the siloxane is capped with Methyl tris(methylethylketoxime)silane ((MTO); MW=301.46) in a glove box (same day) under nitrogen by adding the MTA/ETA to the siloxane and mixing at room temperature for 2 hours, as also described above.

The capped siloxane is then added to the Phenyl-T Resin/toluene solution at 108° C. and refluxed for about 3 hours. As described in greater detail below, films are then cast from this solution. The organosiloxane block copolymer in the solution is analyzed by $^{29}$Si NMR which confirms a structure of $D^{PhMe}_{0.440}T^{Me}_{0.008}T^{Ph}_{0.552}$ with an OZ of about 17.0 mole %. No acetic acid is detected in the solid composition using FT-IR analysis.

Example 4

A 5 L 4 neck round bottom flask is loaded with toluene (1000.0 g) and 280.2 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (500.0 g) and 720.0 g of a silanol terminated PDMS (FW=74.3 g/mole Si; ~1.01 mole % OH) is prepared and the PDMS is capped with 50/50 MTA/ETA (23.77 g, 0.1028 moles Si) in a glove box (same day) under nitrogen by adding the MTA/ETA to the siloxane and mixing at room temperature for 30 minutes, as also described above.

The capped PDMS is then added to the Phenyl-T Resin/toluene solution at 108° C. and refluxed for about 3 hours fifteen minutes.

After reflux, the solution is cooled back to about 108° C. and an additional amount of 50/50 MTA/ETA (22.63 g, 0.0979 moles Si) is added and the solution is then refluxed for an additional 1 hour.

Subsequently, the solution is cooled to 100° C. and then 36.1 g of DI water is added.

The solution including the water is then heated at 88-90° C. for about 30 minutes and then heated at reflux for about 1.75 hours to remove about 39.6 grams of water via azeotropic distillation. The solution is then left overnight to cool.

Subsequently, the solution heated to reflux for 2 hours and then allowed to cool to 100° C. To reduce the acetic acid level, 126.8 g of DI water is then added and azeotropically removed over a 3.25 hour time period. The amount removed from the Dean Stark apparatus is about 137.3 g. The solution is then cooled to 100° C. Subsequently, 162.8 g of water is then added and then azeotropically removed over a 4.75 hour time period. The amount removed from the Dean Stark apparatus is about 170.7 g. The solution is then cooled to 90° C. and 10 g of Darco G60 carbon black is added thereto. The solution is then cooled to room temperature with stirring and then allowed to stir overnight at room temperature.

The solution is then pressure filtered through a 0.45 μm filter to isolate the solid composition.

The solid composition is analyzed by $^{29}$Si NMR which confirms a structure of $D^{Me2}_{0.815}T^{Alkyl}_{0.017}T^{Ph}_{0.168}$ with an OZ of about 6.56 mole %. No acetic acid is detected in the solid composition using FT-IR analysis.

Example 5

A 12 L 3 neck round bottom flask is loaded with toluene (3803.9 g) and 942.5 g of the Phenyl-T resin described above. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (1344 g) and 1829.0 g of the silanol terminated PDMS described immediately above is prepared and the PDMS is capped with MTO (Methyl tris(methylethylketoxime)silane (85.0 g, 0.2820 moles Si)) in a glove box (same day) under nitrogen by adding the MTO to the siloxane and mixing at room temperature for 2 hours, as also described above.

The capped PDMS is then added to the Phenyl-T Resin/toluene solution at 110° C. and refluxed for about 2 hours ten minutes. Subsequently, 276.0 g of n-butanol is added and the solution is then refluxed for 3 hours and then allowed to cool to room temperature overnight.

Subsequently, about 2913 g of toluene is removed by distillation to increase a solids content to ~50 weight %. A vacuum is then applied at 65-75° C. for ~2.5 hours. Then, the solution is filtered through a 5.0 μm filter after setting for 3 days to isolate the solid composition.

The solid composition is analyzed by $^{29}$Si NMR which confirms a structure of $D^{Me2}_{0.774}T^{Me}_{0.009}T^{Ph}_{0.217}$ with an OZ of about 6.23 mole %. No acetic acid is detected in the solid composition using FT-IR analysis.

Example 6

A 1 L 3 neck round bottom flask is loaded with toluene (180.0 g) and 64.9 g of the Phenyl-T resin described. The flask is equipped with a thermometer, Teflon stir paddle, and a Dean Stark apparatus, prefilled with toluene, attached to a water-cooled condenser. A nitrogen blanket is applied. A heating mantle is used to heat the solution at reflux for 30 minutes. The solution is then cooled to 108° C. (pot temperature).

A solution of toluene (85.88 g) and 115.4 g of the silanol terminated PDMS is prepared and the PDMS is capped with ETS 900 (50 wt % in toluene; Average FW=232/4 g/mole Si). in a glove box (same day) under nitrogen by adding ETS 900/toluene (8.25 g, 0.0177 moles Si) to the silanol terminated PDMS and mixing at room temperature for 2 hours.

The capped PDMS is then added to the Phenyl-T Resin/toluene solution at 108° C. and refluxed for about 2 hours.

Subsequently, the solution is cooled back to 108° C. and an additional amount of the ETS900 (15.94 g, 0.0343 moles Si) is added. The solution is then heated at reflux for one hour and then cooled back to 108° C. An additional amount of the ETS 900/toluene (2.23 g, 0.0048 moles Si) is then added and the solution is again heated at reflux for one hour Subsequently, the solution is cooled to 100° C. and 30 mL of DI water is added. The solution is again heated to reflux to remove water via azeotropic distillation. This process is repeated ×.

Then, the solution is heated and ~30 g of solvent is distilled off to increase the solids content. The solution is then cooled to room temperature and filtered through a 5.0 um filter to isolate the solid composition.

The solid composition is analyzed by $^{29}$Si NMR which confirms a structure of $^{Me2}_{0.751}T^{Alkyl}_{0.028}T^{Ph}_{0.221}$ with an OZ of about 7.71 mole %. No acetic acid is detected in the solid composition using FT-IR analysis.

Comparative Example 1

A 1 L 3 neck round bottom Intended Morton Type flask with a bottom drain is loaded with DI water (196.1 g). The flask is equipped with a thermometer, Teflon stir paddle, and a water-cooled condenser. An addition funnel is loaded with PhSiCl3 (82.95 g) and PhMeSiCl$_2$ (58.87 g) and toluene (142.65 g). This solution is added to the flask slowly starting at room temperature. Upon addition to the flask, the solution exotherms to 78° C. The solution is mixed for 15 minutes. Subsequently, the aqueous phase is removed and HCl is removed by water washing.

Then 25 mL DI water is added to the solution and the solution is heated at 80° C. for 15 minutes. The aqueous phase is then removed and the solution is then heated to reflux and additional water is removed via azeotropic distillation. These steps are repeated several times.

Subsequently, the solution is heated to distill solvent and to increase the solids content. The product is then stripped to dryness using a rotavapor at an oil bath temperature of 120° C. and ~0.5 mm Hg and filtered to isolate the product.

The product is analyzed by $^{29}$Si NMR which confirms a structure of $D^{PhMe}_{0.437}T^{Cyclohexyl}_{0.007}T^{Ph}_{0.556}$ with an OH content of about 44.5 mole % (5.55 wt %) and having a FW of about 136 g/mole.

Comparative Example 2

The components set forth below are mixed using a vacuum planetary mixer, Thinky ARV-310, for 2 minutes at 1600 rpm under 2 kPa to form a liquid composition.

Component 1: Average Unit Molecular Formula: (Me$_2$ViSiO$_{1/2}$)$_{0.25}$(PhSiO$_{3/2}$)$_{0.75}$; 5.8 g;
Component 2: Average Unit Molecular Formula: Me$_2$ViSiO(MePhSiO)$_{25}$OSiMe$_2$Vi; 1.8 g;
Component 3: Average Unit Molecular Formula: HMe$_2$SiO(Ph$_2$SiO)SiMe$_2$H; 2.0 g;
Component 4: Average Unit Molecular Formula: (HMe$_2$SiO$_{1/2}$)$_{0.60}$(PhSiO$_{3/2}$)$_{0.4}$; 0.24 g;
Component 5: Average Unit Molecular Formula: (Me$_2$ViSiO$_{1/2}$)$^{0.18}$(PhSiO$_{3/2}$)$_{0.54}$(EpMeSiO)$_{0.28}$ wherein (Ep-gricidoxypropyl); 0.23 g
Component 6: Average Unit Molecular Formula: Cyclic (ViSiMeO$_{1/2}$)$_n$; 0.02 g 1-Ethynyl-1-Cyclohexanol; 240 ppm
Pt Catalyst (1.3-divinyltetramethylsiloxane complex); 2 ppm Comparative Example 3

Comparative Example 3 is prepared from the following using a vacuum planetary mixer:
Vinyldimethylsiloxy terminated polydimethylsiloxane (Average Mw=60,000); 42.9 parts
Vinyldimethylsiloxy terminated polydimethylsiloxane (Average Mw=24,000); 14.5 parts
Vinyldimethylsiloxy and trimethylsiloxy functional silica; 1.0 part
Trimethylsiloxy functional silica; 5.7 parts
1,5-divinyl-1,1,5,5-tetramethyldisiloxane coordinated Platinum catalyst (Pt content 5 ppm for the total composition)
(Allylglycidoxypropyl-SiO$_{3/2}$)$_{0.5}$(MeSiViO$_{2/2}$)$_{0.3}$(Me$_2$SiO$_{2/2}$)$_{0.2}$; 11.7 parts After formation, Comparative Example 3 is casted on a polyethersulfone coated film and then heated at 100° C. for 3 minutes to form a film.

Evaluation of Example and Comparative Examples

After each of the aforementioned Examples are formed, various samples are evaluated to determine Modulus at 25° C., Shore A Hardness (cured), Melt Viscosity at 120° C., Trouser Tear, Tensile Strength, Elongation at Break, and Flexibility. The results of these evaluations are set forth in Table 1 below.

amount of sample sheet available. Before testing no special storage considerations are taken as the sheets are not expected to be significantly affected by small changes in temperature or humidity. Specimens are tested at ambient temperature and humidity with an Instron universal test machine utilizing Bluehill 2 software. For type B and C specimens the test speed used is 500 mm/min and specimens are pulled to failure. Median peak force/thickness is reported. For type T (trouser) specimens a pulling speed of 50 mm/min is used and specimens are pulled until the tear force is seen to level off or until failure occurred. After testing the beginning and ending points of the level region of the force curve are indentified visually. Then the analyzing function of the software is used to calculate the average tear force/thickness within the identified region. If more than one specimen was tested the median reading is reported.

Durometer (ASTM D2240) specimens approximately 6 mm thick are prepared by stacking together multiple pieces of sheets. Test equipment includes an analog Shore A durometer head mounted to an operating stand that both controlled the force and application speed. Three or five measurements are taken depending on size of specimen. Readings are taking after 1 second of contact. Median readings are reported.

Tensile (ASTM D412) Specimens are die cut from sheets typically measuring 1-2 mm in thickness. Preferred specimen size is Type C, although smaller sizes can be cut so that three specimens can be obtained. Before testing no special storage considerations are taken as the sheets are not expected to be significantly affected by small changes in temperature or humidity. Specimens are tested at ambient temperature and humidity with an Instron universal test machine utilizing Bluehill 2 software. Test speed used is 500 mm/min, and specimens are pulled to failure. Median elongation and tensile strength, at both peak and breaking point, are reported along with Young's modulus. Raw stress-strain curves are also exported for further analysis and comparison with other materials.

Formation and Evaluation of Films and a Liquid

After each of the aforementioned Examples are formed, 14.5 mg samples of Examples 2 and 4-6, along with Com-

TABLE 1

| Example | Modulus at 25° C. MPa | Shore A Hardness Cured | Melt Viscosity at 120° C., Pa · s | Trouser Tear kN/m | Tensile Strength MPa | Elongation at Break % | Flexibility |
|---|---|---|---|---|---|---|---|
| Example 1 | 121 | N/A | 71 | 1.8 | 6.66 | 121 | Excellent |
| Example 2 | 250 | 88 | 145 | 1.5 | 4.3 | 195 | Excellent |
| Example 3 | N/A | N/A | 422 | N/A | 8.5 | 26 | Good |
| Example 4 | 1.1 | 36 | 44,000 | 1.0 | 3.5 | 347 | Excellent |
| Example 5 | N/A | 56 | 32,000 | 3.4 | 1.5 | 195 | Excellent |
| Example 6 | 2.8 | 54 | 160,000 | <0.1 | 6.6 | 366 | Excellent |
| Comp. Ex. 1 | Too Brittle To Evaluate | N/A | N/A | N/A | Too Brittle To Evaluate | Too Brittle To Evaluate | Poor |
| Comp. Ex. 2 | 16.3 | 80 | N/A | N/A | 3 | 50 | Poor |
| Comp. Ex. 3 | 0.2 | 36 | N/A | N/A | 4.2 | 500 | Excellent |

Tear (ASTM D624) Specimens are die cut from sheets typically measuring 1-2 mm in thickness. Testing type T (trouser) three specimens are prepared depending on the parative Examples 2 and 3 are placed in an LED package and cured to form Solid State Lights 2 and 4-6 and Comparative Solid State Lights 2 and 3, respectively.

The LED package is TTI-5074 with BridgeLux's LED chip MKO4545C, commercially available from Chiun Precision Industry.

Example 2 is cured via processing during pressing under 10N-30N of gradually increasing pressure and at temperatures increasing from 50-130° C., followed by 150° C./20 minutes and post baking at 160° C. for 3 hours.

Examples 4-6 are each cured at 150° C. for 20 minutes pressing under 10N-30N of gradually increasing pressure followed by heating at 160° C. for 3 hours in an oven.

Comparative Example 2 is cured at 150° C. for 1 hour in an oven without any pressure.

Comparative Example 3 is cured at 150° C. for 1 hour in a press under 10N-30N of gradually increasing pressure but without use of any oven.

During or after formation of each Solid State Light, each Solid State Light is evaluated to determine Refractive Index, Wire Bending During Encapsulation, Reflow Stability (delamination), and Thermal Cycling Stability (# of Cycles Until Wire Opening).

TABLE 2

| | Example/ Light 2 | Example/ Light 4 | Example/ Light 5 | Example/ Light 6 | Comp. Example/ Light 2 | Comp. Example/ Light 3 |
|---|---|---|---|---|---|---|
| RI of Example After Curing | 1.56 | 1.44 | 1.45 | 1.45 | 1.54 | 1.41 |
| Wire bending During Encapsulation | No | Yes | No | Yes | No | Yes |
| Reflow stability (Delamination) | Excellent | Acceptable | Excellent | Acceptable | Poor | N/A |
| Thermal cycling stability (# cycles until wire opening) | Excellent >1000 | Excellent >1000 | Excellent >1000 | Excellent >1000 | Poor ~200 | N/A |

Refractive Index is determined by a prism coupling method with a 632.8 nm wavelength laser at room temperature using Metricon Model2010/M Prism Coupler.

Wire Bending During Encapsulation is determined by microscope observation and comparison between before and after encapsulation.

Reflow Stability (delamination) is determined by observation using an optical microscope with a cross polarizing filter, wherein little light scattering images indicates no delamination. The descriptor "excellent" describes no delamination condition. The descriptor "acceptable" describes little delamination condition. The descriptor "poor" describes significant delamination condition.

Thermal Cycling Stability (# of Cycles Until Wire Opening) is determined by LED light on/off testing, where failure of LEDs to light is indicative of wire opening.

More specifically, the reflow stability of Example 2 is evaluated wherein a single cycle includes exposing the sample to temperatures of −40° C. for 30 minutes ramping up to 125° C. within 2 minutes, holding at 125° C. for 30 minutes and ramping back down to −40° C. within 2 minutes. FIG. 1 shows the result of before and after reflow. The top line shows normal microscope image, and the others show cross-polarized microscope images. Comparison with Comparative Example 2 (see Table 2) shows that Example 2 has superior stability. No delamination from the substrate occurs. Comparative Example 2 exhibits delamination from the PPA white reflector and sometime from the silver backplane. Combined with the excellent thermal cycle stability, Example 2 exhibits high reliable material for LED applications.

FIG. 2 shows that examples 2, 4 and 6 exhibit no wire bond opening even after 1000 cycles, while comparative example 2 exhibits wire bond opening after about 200 cycles.

Additional Examples

Phosphor Incorporation into Copolymer Using 3-Roll Milling

An additional example is also formed that include a phosphor incorporated into the organosiloxane block copolymer using 3-roll mixing. More specifically, a 4.988 g sample of Example 2 is placed on a 3-roll mill (AIMEX BR-150HCV) heated to 80° C. Subsequently, 0.497 g of Intematix phosphor YAG phosphor (NYAG4454) is added to the organosiloxane block copolymer to form a mixture. The mixture is then passed through the 3 roll mill incorporate the phosphor into the organosiloxane block copolymer.

During this process, the phosphor does not agglomerate and no sedimentation is visually observed over two months.

An optical micrograph in reflection mode is set forth as FIG. 4 and shows phosphor homogeneously dispersed therein In contrast, when 100 parts of Comparative example 2 are with 3.5 parts of NTAG4851 using the aforementioned method, complete sedimentation of the phosphor is observed after 24 hours.

Additional Examples

Phosphor Incorporation into Copolymer Using Solution Mixing

An additional sample of Example 2 is dissolved at 70% solids in toluene to form a mixture. Subsequently, the mixture was split into three samples. In a first sample, 25 wt % of CeYAG is added. In a second sample, 25 wt % of CeTAG is added. In a third sample, 25 wt % of EuN is added. This is repeated with samples of Example 4.

Each sample of Examples 2 and 4 is prepared in a 10 mL dental mixer cup, then hand-mixed thoroughly, then mixed with a vortex mixer for ~5 min, and then sonicated for ~45 minutes.

After mixing, each sample of Examples 2 and 4 is then drawn down into a film using an adjustable draw down bar at 10 mil gap setting on a TEFZEL release liner (52). Each sample of Examples 2 and 4 is excellent in resisting settling of the phosphor. An optical micrograph in transmission mode of Example 2 is set forth as FIG. 3 and shows phosphor homogeneously dispersed therein.

Example 7

A composition comprising 35 wt % 1500 g/mole Naphthyl-T Resin-65 wt % 56 dp PhMe siloxane was prepared by charging a 1 L 4-neck round bottom flask with toluene (58.3 g) and naphthyl-T resin (221.7 g solution in toluene=147.0 g solid, 0.7844 moles Si). The flask was equipped with a thermometer, teflon stir paddle, and a Dean Stark apparatus attached to a water-cooled condenser. A nitrogen blanket was applied, Dean Stark was prefilled with toluene, and a heating mantle was used for heating. The reaction mixture was heated at reflux for 30 minutes and 0.05 mL of water were removed. The flask was allowed to cool to 108° C.

A solution of silanol terminated PhMe siloxane (420.0 g solution in toluene=273.0 g siloxane, 2.00 moles Si) was capped with 50/50 MTA/ETA (15.27 g, 0.0672 moles Si). It was prepared in a glove box (same day) under nitrogen by adding 50/50 MTA/ETA to the siloxane and mixing at room temperature for 1 hour.

The siloxane solution was added to the naphthyl-T resin solution quickly at 108° C. The reaction mixture was heated at reflux for 2 hours and 0.20 mL of water removed. The reaction mixture was allowed to cool to 108° C. To the cooled reaction mixture was added 50/50 MTA/ETA (9.91 g, 0.0436 moles). The reaction mixture was heated at reflux for 1 hour.

Repeated the following process two times: cooled to 90° C. and then added deionized water (49 mL). Heated at reflux and removed water via azeotropic distillation over 1 hour.

Distilled off some toluene (99.3 g, along with the majority of remaining acetic acid) to increase the solids content. The mixture was allowed to cool to room temperature and was subsequently pressure filtered through a 5.0 μm filter the following day.

Films (~0.8 mm thick) made using the product from the process described above were optically transparent.

Example 8

A composition comprising 45 wt % Ph-T-55 wt % 124 dp PhMe siloxane was prepared by charging a 12 L 3-neck round bottom flask with toluene (1088.3 g) and phenyl-T resin (217 flake; 1321.8 g, 9.68 moles Si). The flask was equipped with a thermometer, teflon stir paddle, and a Dean Stark apparatus attached to a water-cooled condenser. A nitrogen blanket was applied, Dean Stark was prefilled with toluene, and a heating mantle was used for heating. The reaction mixture was heated at reflux for 30 minutes and 5.7 g of water were removed. The flask was allowed to cool to 108° C.

A solution of silanol terminated PhMe siloxane (2485.4 g solution in toluene=1615.5 g siloxane, 11.84 moles Si) was capped with 50/50 MTA/ETA (28.54 g, 0.126 moles Si). It was prepared in a glove box (same day) under nitrogen by adding 50/50 MTA/ETA to the siloxane and mixing at room temperature for 1 hour.

The siloxane solution was added to the phenyl-T resin solution quickly at 108° C. The reaction mixture was heated at reflux for 2 hours and 10.5 g of water removed. The reaction mixture was allowed to cool to 108° C. To the cooled reaction mixture was added 50/50 MTA/ETA (230.9 g, 1.02 moles). The reaction mixture was heated at reflux for 1 hour.

Repeated the following process two times: cooled to 90° C. and then added deionized water (343 mL). Heated at reflux and removed water via azeotropic distillation over 1 hour. Total amount of aqueous phase removed: 828.9 g (1st cycle: 424.6 g, 2nd cycle: 404.3 g).

Distilled off some toluene (700.0 g, along with the majority of remaining acetic acid) to increase the solids content. The mixture was allowed to cool to room temperature and was subsequently pressure filtered through a 5.0 μm filter the following day.

NVC samples were transparent. No haze was visible when immediately removed from oven. Films (~0.8 mm thick) were also transparent.

Example 9

A composition comprising 45 wt % Me-T-55 wt % 117 dp PhMe siloxane was prepared by charging a 500 mL 4-neck round bottom flask with toluene (63.34 g) and methyl-T resin (40.50 g, 0.52 moles Si). The flask was equipped with a thermometer, teflon stir paddle, and a Dean Stark apparatus attached to a water-cooled condenser. A nitrogen blanket was applied, Dean Stark was prefilled with toluene, and a heating mantle was used for heating. The reaction mixture was heated at reflux for 30 minutes and 5.7 g of water were removed. The flask was allowed to cool to 108° C.

A solution of silanol terminated PhMe siloxane (76.16 g solution in toluene=49.50 g siloxanc, 0.363 moles Si) was capped with 50/50 MTA/ETA (1.22 g, 0.00528 moles Si). It was prepared in a glove box (same day) under nitrogen by adding 50/50 MTA/ETA to the siloxane and mixing at room temperature for 1 hour.

The siloxane solution was added to the methyl-T resin solution quickly at 108° C. The solution turned hazy, but became less hazy during heating to reflux. Added an additional 45 g of toluene to diminish the haze. The reaction mixture was heated at reflux for 2 hours and 0.36 mL of water removed. The reaction mixture was allowed to cool to 108° C. To the cooled reaction mixture was added 50/50 MTA/ETA (3.01 g, 0.0130 moles). the reaction mixture was heated at reflux for 1 hour.

Repeated the following process two times: cooled to 90° C. and then added deionized water (12 mL). Heated at reflux and removed water via azeotropic distillation over 45 minutes. Distilled off some toluene (72.4 g, along with the majority of remaining acetic acid) to increase the solids content to about 60%. The mixture was allowed to cool to room temperature and was subsequently pressure filtered through a 5.0 μm filter the following day.

NVC samples were transparent. No haze was visible when immediately removed from oven. Films (~0.8 mm thick) were also transparent. Films were easily removed from aluminum. RI measured at 633 nm on a film that was cured with 50 ppm DBU was 1.502.

Example 10

A composition comprising 55 wt % Ph-T-45 wt % 184 dp PDMS was prepared by charging a 3 L 4-neck round bottom flask with toluene (678.6 g) and phenyl-T resin (217 flake; 275.0 g, 2.01 moles Si). The flask was equipped with a thermometer, teflon stir paddle, and a Dean Stark apparatus attached to a water-cooled condenser. A nitrogen blanket was applied, Dean Stark was prefilled with toluene, and a heating mantle was used for heating. The reaction mixture was heated at reflux for 30 minutes and 0.7 g of water were removed. The flask was allowed to cool to 108° C.

A solution of silanol terminated PDMS (225.0 g siloxane, 3.03 moles Si) in toluene (250.0 g) was capped with 50/50 MTA/ETA (7.30 g, 0.0321 moles Si). It was prepared in a glove box (same day) under nitrogen by adding 50/50 MTA/ETA to the siloxane and mixing at room temperature for 30 minutes.

The siloxane solution was added to the phenyl-T resin solution slowly (15.5 minutes) at 105-109° C. via an addition funnel. The reaction mixture was heated at reflux for 3 hours and 4.0 mL of water removed. The reaction mixture was allowed to cool to 108° C. To the cooled reaction mixture was added 50/50 MTA/ETA (46.22 g, 0.203 moles Si). The reaction mixture was heated at reflux for 1 hour.

Repeated the following process two times: cooled to 90° C. and then added deionized water (58.3 mL). Heated at reflux and removed water via azeotropic distillation over 1.5 hours. Total amount of aqueous phase removed: 135.9 g.

Distilled off some toluene (312.0 g, along with the majority of remaining acetic acid) to increase the solids content. The mixture was allowed to cool to room temperature and was subsequently pressure filtered through a 5.0 µm filter the following day.

Example 11

A composition comprising 34 wt % Ph-T-184 dp PDMS was prepared using a procedure identical to that of Example 10 apart from the different Ph-T/PDMS composition.

Example 12

A composition comprising 45 wt % methyl-T resin-55 wt % 99 dp TFP siloxane was prepared by charging a 500 mL 4-neck round bottom flask with 4-chlorobenzotrifluoride (CBTF) (120.38 g) and the following methyl-T-resin (45.0 g, 0.582 moles Si): Methyl-T Resin $D^{Me2}_{0.10}T^{Me}_{0.80}T^{Ph}_{0.10}FW=77.3$ g/mole Si.

The flask was equipped with a thermometer, teflon stir paddle, and a Dean Stark apparatus attached to a water-cooled condenser. A nitrogen blanket was applied, Dean Stark was prefilled with CBTF, and a heating mantle was used for heating. The reaction mixture was heated at reflux for 30 minutes and then cooled to cooled to 138° C. (pot temperature).

A solution of silanol terminated trifluoropropylmethylsiloxane (TFP siloxane) (84.62 g solution=55.00 g siloxane, 0.352 moles Si) was capped with 50/50 MTA/ETA (1.70 g, 0.00746 moles Si). It was prepared in a glove box (the day before) under nitrogen by adding 50/50 MTA/ETA to the siloxane and mixing at room temperature for 2 hours. Reaction was verified complete by IR analysis.

The siloxane solution was added to the resin solution quickly at 138° C. Reaction mixture turned very hazy. Added 83.3 g of CBTF to reduce the solids content down to 30% solids. Reaction mixture was still hazy. Added 66.7 g of CBTF to reduce the solids content further down to 25% solids. Reaction mixture now only had a light haze. The reaction was heated at reflux for a total of 5 hours.

Distilled off some solvent (150.3 g) to increase the solids content (33 minutes) to about 40% solids. The reaction mixture was allowed to cool to room temperature. The solution was highly viscous and hazy. Added CBTF (36.0 g) to reduce the viscosity of the solution.

NVC samples were transparent. No haze was visible when immediately removed from the oven. RI measured at 633 nm on a film that was cured with 50 ppm DBU was 1.409.

Example 13

The following double-layer films were successfully created and laminated (LED side listed first, air side second):

Naphthyl-T-PhMe (Example 7) and 45 wt % Ph-T-120 dp PhMe (Example 8)

Naphthyl-T-PhMe (Example 7) and 34 wt % Ph-T-PDMS (Example 11)

45 wt % Ph-T PhMe (Example 8) and 34 wt % Ph-T-PDMS (Example 11).

First the single layer films were formed using standard solution draw down approaches onto a silicone-treated PET release liner. For a target of 100 µm thickness, a 10 mill large draw-down bar was used. After sitting in ambient conditions for a few minutes, the film was placed in the oven at 70° C. for over an hour. The approximately 100 µm thickness was achieved for Napthyl-T-PhMe (Example 7) and Ph-T-PhMe (Example 8). This first layer is intended to make intimate contact with the LED chip after lamination.

The second layer, targeted at 250 µm thickness, was prepared by drop casting a solution into a rectangular "boat" followed by slow evaporation of the solvent. A fluoro-treated film was used as the material for the "boat". This method was used to create a thicker film for Ph-T-PhMe (Example 8) and Ph-T-PDMS (Example 11).

Next, double layer films were created by using a standard office laminator set at 110° C. The two pre-made films were placed on top of each other in between fluoro-coated release liners and passed through the laminator to give two layer films, where the layers are adhered to one another.

Figure 9A:
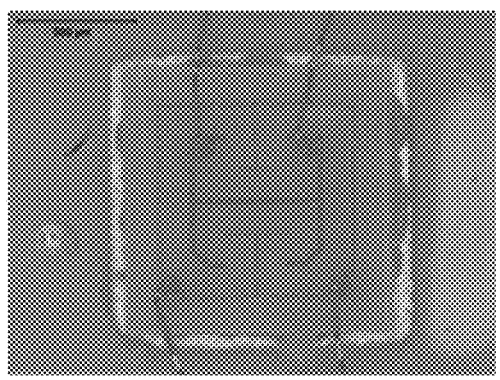
FIGS. 9A and 9B are photographs of Naphthyl-T-PhMe (Example 7) and 34 wt % Ph-T-PDMS (Example 11) laminated onto an LED.
Figure 9B:
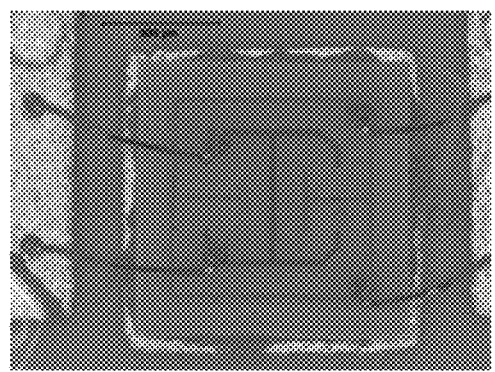

These two-layer films were laminated using the following procedure with a standard vacuum laminator: 1) Pre-heat hot plate and vacuum fixture with bladder, 2) when Naph-T-PhMe is the layer in contact with the LED, 85° C. was used as the hot plate temperature. When Ph-T-PhMe is the layer in contact with the LED, 135° C. was used as the hot plate temperature. Photographs showing Naphthyl-T-PhMe (Example 7) and 34 wt % Ph-T-PDMS (Example 11) laminated onto an LED is shown in FIGS. 9A and 9B.

Example 14

Figure 10A:
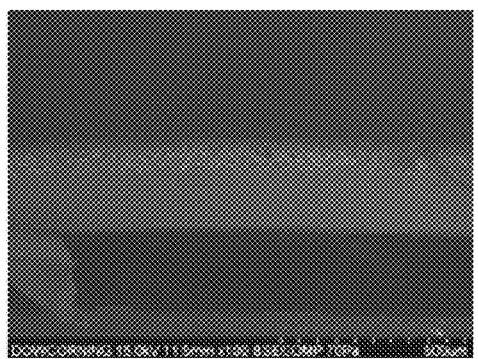
FIGS. 10A and 10B are photographs of layered compositions.
Figure 10B:
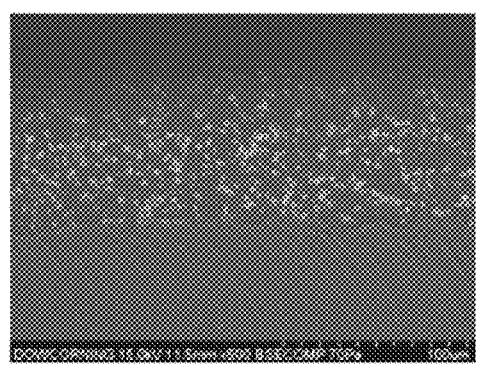

A similar procedure as in Example 13 was used to prepare a thin film of phosphor containing Naphthyl-T-PhMe (Example 7) on top of a thicker Ph-T-PDMS layer (Example 11). To prepare the phosphor containing layer, 50 wt % (vs. total solids) was mixed into the Naphthyl-T-PhMe solution using a planetary mixer. Photographs of the layered compositions are shown in FIGS. 10A and 10B.

Example 15

WVTR was measured using the wet cup method described in ASTM E96-95. Specific conditions used to run the wet cup method: a dry box was used to create a stronger driving force for water permeation. The table below shows the results for different single layer and one two-layer architecture:

|  | Ph-T-PhMe | 55 wt % Ph-T-PDMS | 35 wt % Naphthyl-T-PhMe | 34 wt % Ph-T-PDMS | Naphthyl-T-PhMe + 34 wt % Ph-T-PDMS |
|---|---|---|---|---|---|
| Example | 8 | 10 | 7 | 11 | 7 and 11 |
| Thickness (µm) | 1000 | 300 | 215 | 274 | 157 and 263 |
| WVTR (g/m²/day) | 20.5 | 91 | 18 | 143 | 23 |
| 1 mm estimated | 20.5 | 84 | 7.4 | 137 | 18 |

Note that "1 mm estimated" values were obtained by using a WVTR vs. thickness curve established for the material made in Example 8.

These examples show that WVTR can be significantly reduced by incorporation of a barrier layer like Naphthyl-T-PhMe into a two-layer film.

Flowchart

Figure 11:
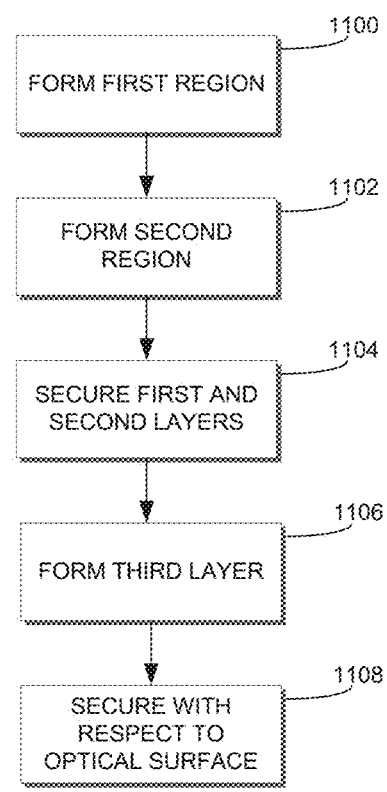
FIG. 11 is a flowchart for making an optical article.

FIG. 11 is a flowchart for making an otical article. The flowchart can relate to any optical article included herein and various optical articles not specifically disclosed herein. Additionally, the flowchart can optionally relate to the creation of an optical assembly, such as is disclosed herein.

At 1100, a first region of a silicone-containing composition is formed. The first region has a first refractive index. In various examples, the first region is formed by the formation of, and is at least a portion of, a first layer of the silicone-containing composition. In various examples, the first layer is a first composition. In an example, the first composition has a first concentration of a material.

At 1102, a second region of the silicone-containing composition is formed. The second region has a second refractive index different than the first refractive index. In various examples, the second region is formed by the formation of, and is at least a portion of, a second layer of the silicone-containing composition. In various examples, the first and second region and, where applicable, the first and second layers are formed concurrently. In various examples, the second layer is a second composition different than the first composition. In an example, the second composition has a first concentration of a material different from the first concentration.

In various examples, the material of the first and second compositions is one of a disiloxy unit, a trisiloxy unit, and/or a silanol group; an additive; a byproduct from the synthesis of the first and/or second composition; or combinations thereof. In various examples, the material of the first and second compositions has lamellar and/or spherical features. In various examples, the material of the first and second compositions have irregularly shaped and/or cylindrical features. In various examples, the material is a first material and the first and second compositions further have a second material different than the first material. In an example, the first and second concentrations are based on a concentration of the first material relative to the second material.

In an example, the first layer defines a first major plane and the second layer defines a second major plane, and the first and second major planes are substantially parallel with respect to one another. In an example, the first layer is in contact with the second layer.

In various examples, the silicone-containing composition has a refractive index concentration gradient between the first region and the second region. In such examples, the silicone-containing composition may form a sheet having a first major surface and a second major surface. In such an example, the first region is proximate the first major surface and the second region is proximate the second major surface. In certain examples, the concentration gradient extends from the first major surface to the second major surface. In various examples, the silicone-containing composition comprises a resin-linear composition or a hot melt silicone-containing composition.

At 1104, where the first and second layers are formed, the first and second layers are secured with respect to one another. In an example, securing the first and second layers forms a third region having a third refractive index, the third region being positioned between the first region and the second region, the third refractive index having a value between a value of the first refractive index and a value of a second refractive index. In an example, the third region includes a third composition that is a combination of the first composition and the second composition. In an example, the third composition is formed, at least in part, by applying at least one of heat and a solvent to the first and second compositions. In an example, the third composition comprises a mixture of the first and second compositions.

At 1106, a third layer is optionally formed. In various examples, the third layer has a third composition having a third refractive index. In various examples, the third layer has a third major plane substantially parallel with respect to the first and second major planes.

At 1108, the silicone-containing composition is optionally secured with respect to an optical surface of an optical device to form an optical assembly. The silicone-containing composition is configured to refract light incident to the optical surface according to the first and second refractive indices.

One or more of the values described above may vary by ±5%, ±10%, ±15%, ±20%, ±25%, etc. so long as the variance remains within the scope of the disclosure. Unexpected results may be obtained from each member of a Markush group independent from all other members. Each member may be relied upon individually and or in combination and provides adequate support for specific embodiments within the scope of the appended claims. The subject matter of all combinations of independent and dependent claims, both singly and multiply dependent, is herein expressly contemplated. The disclosure is illustrative including words of description rather than of limitation. Many modifications and variations of the present disclosure are possible in light of the above teachings, and the disclosure may be practiced otherwise than as specifically described herein.

What is claimed is:

1. An optical article, comprising:
 a silicone-containing composition, comprising
 a first region having a first refractive index; and
 a second region having a second refractive index different than the first refractive index;
 wherein:
  the silicone-containing composition comprises a first composition having the first refractive index and corresponding to the first region; and a second composition having the second refractive index and corresponding to the second region, the second composition being different than the first composition;
  the first composition has a first concentration of a material and the second composition has a second concentration of a material different than the first concentration; and
 wherein the silicone-containing composition includes at least one of a resin-linear composition, the resin-linear composition comprising organosiloxane block copolymers containing:
 40 to 90 mole percent disiloxy units of the formula $[R^1_2SiO_{2/2}]$,
 10 to 60 mole percent trisiloxy units of the formula $[R^2SiO_{3/2}]$,
 0.5 to 25 mole percent silanol groups [SiOH];
  wherein:
   $R^1$ is independently a $C_1$ to $C_{30}$ hydrocarbyl,
   $R^2$ is independently a $C_1$ to $C_{20}$ hydrocarbyl;

wherein:
the disiloxy units [R$^1_2$SiO$_{2/2}$] are arranged in linear blocks having an average of from 10 to 400 disiloxy units [R$^1_2$SiO$_{2/2}$] per linear block,
the trisiloxy units [R$^2$SiO$_{3/2}$] are arranged in non-linear blocks having a molecular weight of at least 500 g/mole, at least 30% of the non-linear blocks are crosslinked with each other and are predominately aggregated together in nano domains, each linear block is linked to at least one non-linear block; and
the organosiloxane block copolymer has a weight average molecular weight of at least 20,000 g/mole, and is a solid at 25° C.

2. The optical article of claim 1, wherein the material comprises at least one of lamellar and spherical features.

3. The optical article of claim 1, wherein the material is a first material and wherein the first and second compositions further have a second material different than the first material, wherein the first and second concentrations are based on a concentration of the first material relative to the second material.

4. The optical article of claim 1, wherein the first region is at least a portion of a first layer defining a first major plane and the second region is at least a portion of a second layer defining a second major plane, wherein the first and second major planes are substantially parallel with respect to one another.

5. The optical article of claim 4, wherein the first layer is in contact with the second layer.

6. The optical article of claim 4, further comprising a third region having a third refractive index, the third region being positioned between the first region and the second region, the third refractive index having a value between a value of the first refractive index and a value of a second refractive index.

7. The optical article of claim 6, wherein the third region includes a third composition that is a combination of the first composition and the second composition.

8. The optical article of claim 7, wherein the third composition is formed, at least in part, by applying heat to the first and second compositions.

9. The optical article of claim 8, wherein the third composition comprises a mixture of the first and second compositions.

10. The optical article of claim 7, wherein the third composition is formed, at least in part, by applying a solvent to at least the first composition.

11. The optical article of claim 4, wherein the silicone-containing composition further comprises a third layer having a third composition having a third refractive index, wherein the third layer has a third major plane substantially parallel with respect to the first and second major planes.

12. The optical article of claim 1, wherein the silicone-containing composition has a refractive index concentration gradient between the first region and the second region.

13. The optical article of claim 12, wherein the silicone-containing composition forms a sheet having a first major surface and a second major surface, wherein the first region is proximate the first major surface and the second region is proximate the second major surface.

14. The optical article of claim 13, wherein the concentration gradient extends from the first major surface to the second major surface.

15. An optical assembly, comprising:
the optical article of claim 1; and
an optical device having an optical surface, wherein the optical article is configured to refract light incident to the optical surface according to the first and second refractive indices.

16. A method for making the optical article of claim 1, comprising: forming a first region of a silicone-containing composition, the first region having a first refractive index; and forming a second region of the silicone-containing composition, the second region having a second refractive index different than the first refractive index.

17. The method of claim 16, wherein forming the first region comprises forming a first composition having the first refractive index, wherein forming the second region comprises forming a second composition having the second refractive index, the second composition being different that the first composition, and further comprising: securing the first composition with respect to the second composition.

18. The method of claim 16, wherein forming the first region and forming the second region are performed concurrently.

19. A method for making the optical assembly of claim 15, comprising:
forming a first region of a silicone-containing hot melt, the first region having a first refractive index;
forming a second region of the silicone-containing hot melt, the second region having a second refractive index different than the first refractive index; and
securing the silicone-containing composition with respect to an optical surface of an optical device, wherein the silicone-containing composition is configured to refract light incident to the optical surface according to the first and second refractive indices.

20. The optical article of claim 1, wherein at least one of the material of the first composition and the material of the second composition comprises lamellar features or at least one of irregularly shaped and cylindrical features.

* * * * *